US006063453A

United States Patent [19]

Tomida et al.

[11] Patent Number: 6,063,453

[45] **Date of Patent: *May 16, 2000**

[54] METHOD OF MANUFACTURING ELECTRON-EMITTING DEVICE AND IMAGE-FORMING APPARATUS COMPRISING SUCH DEVICES

[75] Inventors: Yoshinori Tomida, Atsugi; Hisaaki Kawade, Yokohama; Masahito Niibe, Himeji; Toshikazu Ohnishi, Machida; Yoshimasa Okamura, Odawara, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/961,223

[22] Filed: Oct. 30, 1997

Related U.S. Application Data

[63] Continuation of application No. 08/359,746, Dec. 20, 1994, abandoned.

[30] Foreign Application Priority Data

| | | | |
|---|---|---|---|
| Dec. 22, 1993 | [JP] | Japan | 5-345477 |
| Dec. 22, 1993 | [JP] | Japan | 5-345478 |

[51] Int. Cl.$^7$ .............................. B05D 3/00; B05D 5/12; C23C 16/00

[52] U.S. Cl. .......................... 427/532; 427/545; 427/546; 427/586; 427/597; 427/78; 427/253; 427/255.19; 427/255.31

[58] Field of Search .................................... 427/555, 556, 427/557, 558, 561, 593, 597, 584, 586, 587, 77, 78, 226, 229, 248.1, 253, 255.1, 255.2, 255.3, 532, 545, 546, 252, 255.19, 255.31, 255.32, 255.34, 255.35, 255.36

[56] References Cited

U.S. PATENT DOCUMENTS

| | | | |
|---|---|---|---|
| 3,978,247 | 8/1976 | Brandy et al. | 427/271 |
| 4,543,270 | 9/1985 | Oprysko et al. | 427/586 |
| 4,743,463 | 5/1988 | Ronn et al. | 427/597 |
| 4,948,623 | 8/1990 | Beach et al. | 427/586 |
| 4,957,851 | 9/1990 | Tomida et al. | 430/272 |
| 4,970,196 | 11/1990 | Kim et al. | 427/597 |

(List continued on next page.)

FOREIGN PATENT DOCUMENTS

| | | | |
|---|---|---|---|
| 0343645 | 11/1989 | European Pat. Off. | H01J 1/30 |
| 2113336 | 9/1971 | Germany . | |
| WO93-05530 | 3/1993 | WIPO | H01J 37/317 |

OTHER PUBLICATIONS

Translation of DE–05–2113336, German Patent to Thomson–CSF, Sep. 1971.

The Electrochemical Society, Inc./Vapor Deposition, Carroll F. Powell, pp. 248–251, "Chemical Vapor Deposition". No Date Given.

Thin Film Processes, John L. Vossen, pp. 261–265 & 315, 1978, "Chemical Vapor Deposition of Inorganic Thin Films". No Month.

Patent Abstracts of Japan, vol. 016 No. 064 (E–1167), Feb. 18, 1992 & JP–A–03 261026 (Canon Inc.), Nov. 20, 1991. M.Shenya.

(List continued on next page.)

*Primary Examiner*—Marianne Padgett
*Attorney, Agent, or Firm*—Fitzpatrick, Cella, Harper & Scinto

[57] ABSTRACT

An electron-emitting device having an electroconductive film including an electron-emitting region and arranged between a pair of electrodes is manufactured by forming an electroconductive film on a substrate and producing an electron-emitting region in the electroconductive film. The electroconductive film is formed on the substrate by heating the substrate in an atmosphere containing a gasified organic metal compound to a temperature higher than the decomposition of the gasified organic metal compound.

11 Claims, 25 Drawing Sheets

U.S. PATENT DOCUMENTS

| | | | |
|---|---|---|---|
| 4,987,006 | 1/1991 | Williams et al. | 427/597 |
| 5,136,212 | 8/1992 | Eguchi et al. | 315/150 |
| 5,139,818 | 8/1992 | Mance | 427/586 |
| 5,376,409 | 12/1994 | Kaloyeros et al. | 427/255.1 |
| 5,407,710 | 4/1995 | Baum et al. | 427/586 |

OTHER PUBLICATIONS

Patent Abstracts of Japan, vol. 014, No. 573 (E–1015), Dec. 19, 1990 & JP–A–02 247936 (Canon Inc.), Oct. 3, 1990. N. Ichiro.

Patent Abstracts of Japan, vol. 016 No. 271 (E–1218), Jun. 18, 1992 & JP–A–04 065050 (Canon Inc.), Mar. 2, 1992. I. Hisami.

Patent Abstracts of Japan, vol. 012 No. 311 (M–734), Aug. 24, 1988 & JP–A–63 082788 (Matsushita Electric In Co Ltd), Apr. 13, 1988.

Patent Abstracts of Japan, vol. 016 No. 434 (M–1308), Sep. 10, 1992 & JP–A–04 147888 (Fuji Xerox Co Ltd), May 21, 1992.

STRIPE

MATRIX

METHOD OF MANUFACTURING ELECTRON-EMITTING DEVICE AND IMAGE-FORMING APPARATUS COMPRISING SUCH DEVICES

This application is a continuation of application Ser. No. 08/359,746 filed Dec. 20, 1994 now abandoned.

BACKGROUND OF THE INVENTION

1. Field of the Invention

This invention relates to a method of manufacturing an electron-emitting device and an image-forming apparatus comprising such devices as electron sources. More particularly, it discloses a novel method of manufacturing a surface conduction electron-emitting device which is categorized as a cold cathode type electron-emitting device.

2. Related Background Art

There have been known two types of electron-emitting device; the thermoelectron type and the cold cathode type. Of these, the cold cathode type include the field emission type, the metal/insulation layer/metal type and the surface conduction type.

A surface conduction electron-emitting device is realized by utilizing the phenomenon that electrons are emitted out of a small thin film formed on a substrate when an electric current is forced to flow in parallel with the film surface. A surface conduction electron-emitting device is typically prepared by arranging a pair of device electrodes on an insulating substrate and an electrically conductive thin film, which may be a metal oxide film, between the electrodes to electrically connect them (hereinafter referred to as "thin film for forming an electron-emitting region") and subjecting the thin film to an electrically energizing process referred to as "electric forning" to locally destroy the this film and produce therein an electron-emitting region. The thin film is in fact a film consisting of fine particles of a metal oxide before and after the electric forming operation. Hereinafter, a thin film having an area for forming an electron-emitting region is simply referred to as a thin film including an electron-emitting region.

An electron-emitting device is a so-called non-linear device that shows a sudden and sharp increase in the emission current Ie when the voltage applied thereto exceeds a certain level (a threshold voltage), whereas the emission current is practically undetectable when the applied voltage is found lower than the threshold. Because of this remarkable feature, an image-forming apparatus can be realized by using an electron source comprising a plurality of surface conduction electron-emitting devices and a fluorescent body that emits visible light when irradiated with electrons emitted from the electron source.

materials that can be used for a thin film including an electron-emitting region include, besides metal oxides, metal and carbon. When a metal or metal oxide is used, an organic metal compound is applied to the substrate to form a thin film of the compound and then baked to produce a thin metal oxide film. Massive efforts are currently being made to fully exploit the potential of this method because it involves a relatively simple manufacturing process and can be used to prepare an image-forming apparatus having a large display screen.

FIGS. 11A through 11K of the accompanying drawings schematically illustrate steps of manufacturing an electron-emitting device using a conventional method. Note that Steps a through k described below correspond to illustrations FIGS. 11A through 11K respectively.

Step a: Electrodes 5 and 6 are formed on an insulating substrate 1.

Step b: A film of a selected material such as Cr is formed on the entire surface of the substrate 1.

Step c: Resist is applied on the entire surface of the film formed in step b.

Step d: The applied resist is exposed to light, using a photo-mask having a pattern for a thin film including an electron-emitting region to be formed there.

Step e: The resist is photographically developed.

Step f: The Cr of the areas not covered by the resist is removed by etching, using an acidic etchant.

Step g: The remaining resist is removed by means of an organic solvent.

Step h: An organic metal compound solution is applied to the product of Step g by using an appropriate means such as a spinner to form an organic metal thin film 7.

Step i: The organic metal compound thin film 7 is turned into a metal oxide thin film as it is baked in a furnace at 300° C. for about 10 minutes.

Step j: A thin film 2 for forming an electron-emitting region is formed to conform to an intended pattern by removing the remaining Cr by means of a lift-off method.

Step k: An electron-emitting region 3 is produced by means of an electric forming process.

However, the above described known method involving a baking process is accompanied by a problem that it cannot rigorously control the thickness of the thin film including an electron-emitting region and can produce thin films with different thicknesses.

Thus, with this known method, electron-emitting devices can operate with varied performances for electron emission so that an image-forming apparatus realized by using an electron source comprising such electron-emitting devices can be poorly adapted for high definition image display because of the varied and unstable performances of the electron-emitting devices.

Additionally, since the entire surface of the thin film of the organic metal compound is baked by the above described known method, it requires the use of a photolithography or dry etching technique for the patterning operation to makes the entire process rather cumbersome. Particularly, it is extremely difficult using this method to realize a large display screen by two-dimensionally arranging a large number of electron-emitting devices.

SUMMARY OF THE INVENTION

Therefore, it is an object of the present invention to provide a novel method of manufacturing an electron-emitting device comprising a thin film including an electron-emitting region that can be rigorously controlled for its performance of electron-emission as well as an image-forming apparatus comprising such electron-emitting devices that operates without varied performances of the devices.

When a plurality of electron-emitting devices are used for the electron source of a high definition image display apparatus, they must be rigorously controlled to minimize the rate of malfunctioning. This objective can be achieved mainly by reducing the number of steps involved in the overall manufacturing process and a reduced number of manufacturing steps can be effectively reflected to the manufacturing cost.

Therefore, it is another object of the present invention to provide a method of manufacturing an electron-emitting device and an image-forming apparatus comprising such devices with a reduced number of steps.

According to a first aspect of the invention, the above objects and other objects of the invention are achieved by providing a method of manufacturing an electron-emitting device having an electroconductive film including an electron-emitting region and arranged between a pair of electrodes, said method comprising a step of forming an electroconductive film on a substrate and a step of producing an electron-emitting region in said electroconductive film, wherein said step of forming an electroconductive film on a substrate includes a step of heating said substrate placed in an atmosphere containing a gasified organic metal compound to a temperature higher than the decomposition of said gasified organic metal compound.

According to a second aspect of the invention, there is provided a method of manufacturing an electron-emitting device having an electroconductive film including an electron-emitting region and arranged between a pair of electrodes, said method comprising a step of forming an electroconductive film on a substrate and a step of producing an electron-emitting region in said electroconductive film, wherein said step of forming an electroconductive film on a substrate includes a step of heating a film containing a sublimatable compound and transferring the sublimatable compound onto the substrate and a step of baking the transferred sublimatable compound.

According to a third aspect of the invention, there is provided a method of manufacturing an image-forming apparatus comprising a number of electron-emitting devices, each having an electroconductive film including an electron-emitting region and arranged between a pair of electrode, and an image-forming member for producing images when irradiated with electron beams, wherein said electron-emitting devices are manufactured by any of the above methods of manufacturing an electron-emitting device.

DETAILED DESCRIPTION OF THE PREFERRED EMBODIMENTS

Figure 1A:
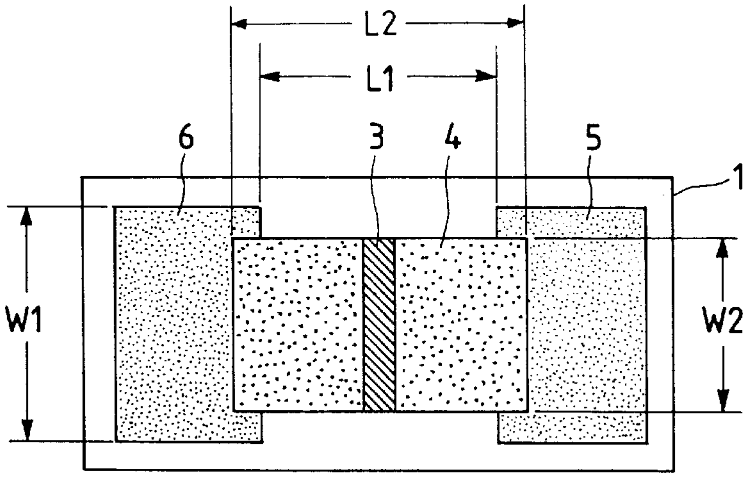
FIGS. 1A and 1B are schematic views of an electron-emitting device manufactured by a method according to the invention in Example 1.

Firstly, a method of manufacturing an electron-emitting device according to an aspect of the invention will be described by referring to FIGS. 2A through 2C. Such a device is typically illustrated in FIGS. 1A and 1B. Note that Steps a through c described below correspond to illustrations FIGS. 2A through 2C respectively.

Step a: After thoroughly cleaning a substrate 1 with pure water and an organic solvent, a material for device electrodes are deposited on the substrate by an appropriate means such as vacuum deposition or sputtering and a pair of device electrodes 5 and 6 are formed on the insulating substrate 1 by photolithography.

Materials that can be used for the substrate 1 include quartz glass, glass containing impurities such as Na to a reduced concentration level, soda lime glass, glass substrate realized by forming an $SiO_2$ layer on soda lime glass by means of sputtering, ceramic substances such as alumina.

While the oppositely arranged device electrodes 5 and 6 may be made of any highly conductive material, preferred candidate materials include metals such as Ni, Cr, Au, Mo, W, Pt, Ti, Al, Cu and Pd and their alloys, printable conductive materials made of a metal or a metal oxide selected from Pd, Ag, $RuO_2$, Pd—G and glass, transparent conductive materials such as $In_2O_3$—$SnO_2$ and semiconductor materials such as polysilicon.

Step b: A thin film of a metal or metal oxide is formed between the device electrodes 5 and 6 on the insulating substrate 1 by chemical vapor deposition (CVD) in a hermetically sealed vessel and then the formed thin film is subjected to a patterning operation, using a technique such as lift-off or etching, to produce a thin film 4 having an electron-emitting region.

More specifically, an organic metal compound is heated to a temperature higher than the boiling point or the sublimation temperature and lower than the decomposition temperature thereof in order to gasify the compound. Note that, if the boiling point or the sublimation temperature of the organic metal compound is close to its decomposition temperature, the pressure in the hermetically sealed vessel is preferably reduced to lower the boiling point or the sublimation temperature of the compound within the vessel.

On the other hand, the insulating substrate 1 arranged within the hermetically sealed vessel is heated to a temperature higher than the decomposition temperature of the organic metal compound to decompose the compound and isolate the organic component of the compound until a film of the metal or that of an oxide of the metal is produced on the substrate 1. The inside of the vessel needs to be totally evacuated to produce a metal film for the above operation, whereas the vessel has to be fed with oxygen during the operation if a metal oxide film is to be obtained.

Materials that can be used as an organic metal compound for the purpose of the invention are those that can easily emit electrons when a voltage is applied thereto or those having a low work function and include metals such as Pd, Ru, Ag, Au, Ti, In, Cu, Cr, Fe, Zn, Sn, Ta, W, Pb, Hg, Cd, Pt, Mln, Sc, La, Co, Ce, Zr, Th, V, Mo, Ni, Os, Rh and Ir and alloys such as AgMg, NiCu, and PbSn.

The organic component of the compound is preferably selected from carboxylates, oxalates, alkylated metals and arylated metals.

A complex can be formed when a transition metal is used for the purpose of the present invention and possible unidentate ligands includes $I^-$, $SCN^-$, $CN^-$, $H^-$, $S_2O_3^-$, $Cl^-$, $ClO_4^-$, $NO_3^-$, $CH_3CO_2^-$, $SO_4^-$, $CO_3^-$, $PO_3^-$, those expressed by general formulas $R_2S$, RSH, $R_3P$, $R_3As$, $R^-$, $R_2O$, ROH, $RNH_2$, $OR^-$ (where R represents an alkyl group), ethylenediamine, acetylacetonate, 2,2'-dipyridyl and o-phenylenebis(dimethylamine) whereas possible candidates of tridentate ligands include 2,2',2"-terpyridine and diethylenetriamine and possible tetradentate and hexadentate ligands respectively include triethylenetetraamine and ethylenediamine-tetraacetic acid.

An organic metal compound can be made sublimatable for the purpose of the present invention by forming a complex, using an amine as a component of a mixture or as a ligand, if the organic metal compound is an acetate of a metal or a halogenated metal. The organic component of the complex is an amine if a halogenated metal is used. Amines that can be used for the purpose of the invention include monoalkylamines such as n-propylamine, iso-propylamine, dialkylamines such as diethylamine, di-n-propylamine, di-iso-propylamine, di-n-butylamine, trialkylamines such as triethylamine, tri-n-propylamine, tri-n-burylamine and saturated and unsaturated cyclic amines such as pyridine and piperidine.

The reason why an organic metal compound is used is that it can be gasified at relatively low temperature to produce the component metal or an oxide thereof when it is baked on a substrate and that it will be substantially entirely decomposed at or around 300° C. to become a metal, an inorganic compound such as a metal oxide or a compound carrying on its surface a small and simple organic compound having a small number of carbon atoms. Contrary to this, a halogenated compound having no organic component or a salt of an inorganic acid normally has a melting point, a boiling point, a sublimation temperature and a decomposition temperature that are higher than 1,000° C., exceeding by far the upper limit of the heat resistivity of the material of the substrate and that of the device electrodes of the electron-emitting device.

Materials containing an organic metal compound that can be preferably used for the purpose of the invention are those having a relatively low boiling point and a sublimation temperature that are lower than the decomposition temperature by tens to hundreds degrees in Celsius and compounds and complexes containing an organic metal compound formed by combining a metal carboxylate or a halogenated metal and an amine. Most preferably, the metal carboxylate of the organic metal compound is palladium carboxylate and the organic metal compound to be used for the purpose of the invention has a sublimation temperature between 50° C. and 180° C. and a thermal decomposition temperature higher than 180° C. under the atmospheric pressure.

Obviously, if a material containing an organic metal compound to be used for the purpose of the invention has a relatively low boiling point or a sublimation temperature which is lower than the decomposition temperature by tens to hundreds degrees in Celsius, it can be gasified on a stable basis without decomposition and therefore becomes decomposed only at a higher temperature. If, contrary to this, the difference between the boiling point or the sublimation temperature and the decomposition of the material is relatively small, a high degree of vacuum is required to gasify it under a reduced pressure to carry out a CVD operation. Then, the partial pressure of the organic metal compound will be too low for the metal of the compound, or an oxide thereof, to be deposited on the substrate at a feasible rate. Thus, a highly sublimatable mixture or complex (capable of producing a high vapor pressure) of a metal carboxylate and an amine provides a recommended candidate for the organic metal compound to be used for the purpose of the invention as it can be gasified at relatively low temperature in a relatively low degree of vacuum and hence the metal of the compound, or an oxide thereof, can be deposited effectively and efficiently on the substrate.

Step c: An electrically energizing operation, which is also called an electric forming operation, is conducted on the thin film 2 prepared by Step b above to produce an electron-emitting region 3 in the thin film 4 which is structurally modified from the thin film 4.

For the forming operation, a constant pulse voltage or an increasing pulse voltage may be applied. The operation using a constant pulse voltage will be described first by referring to FIG. 3A, showing a pulse voltage having a constant pulse height.

Figure 3A:
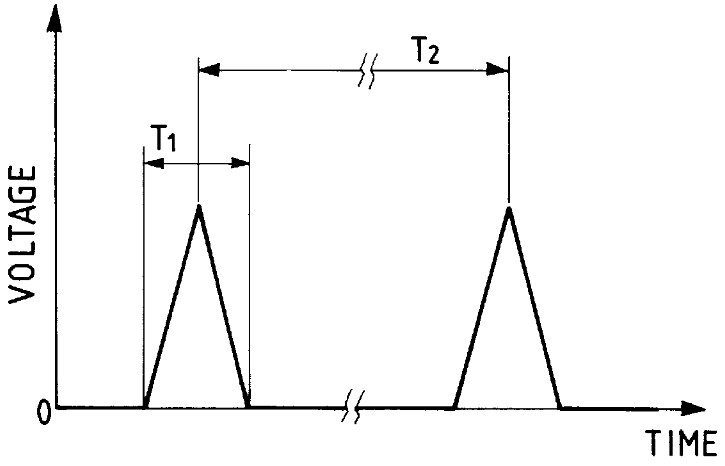
FIGS. 3A, 3B and 3C are graphs of three possible voltage waveforms that can be used for an electric forming operation.

In FIG. 3A, the pulse voltage has a pulse width T1 and a pulse interval T2, which are between 1 and 10 microseconds and between 10 and 100 milliseconds respectively. The height of the triangular wave (the peak voltage for the electric forming operation) may be appropriately selected so long as the voltage is applied in vacuum.

Figure 3B:
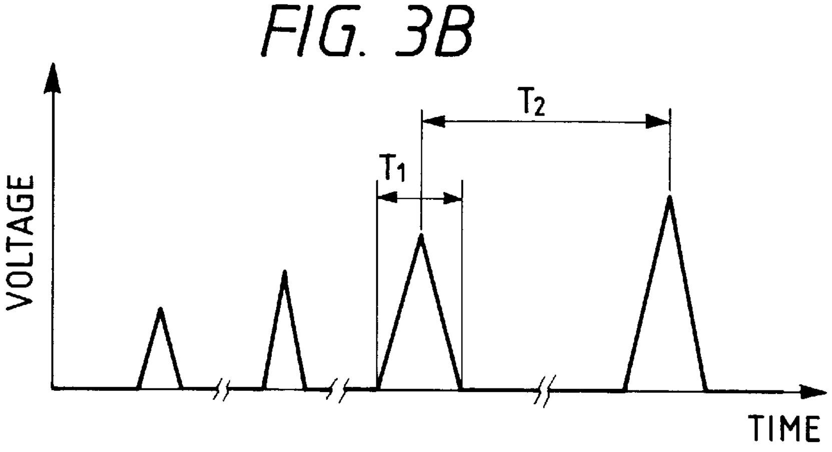
Figure 3C:
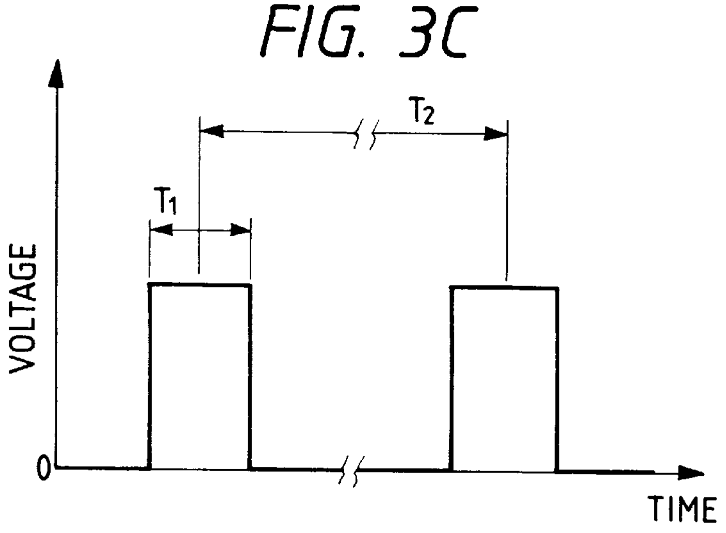
Figure 4A:
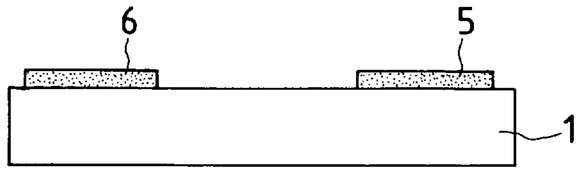
FIGS. 4A through 4E are schematic side views of an electron-emitting device manufactured by a method according to the invention in Example 7, showing different manufacturing steps.
Figure 4B:
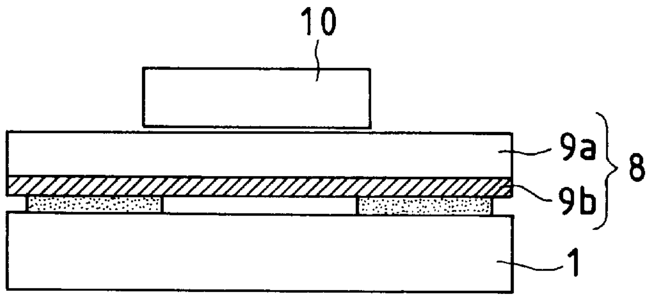
Figure 4C:
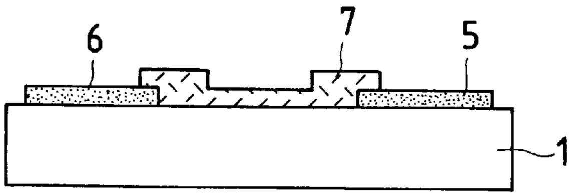
Figure 4D:
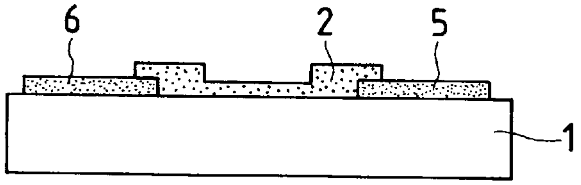
Figure 4E:
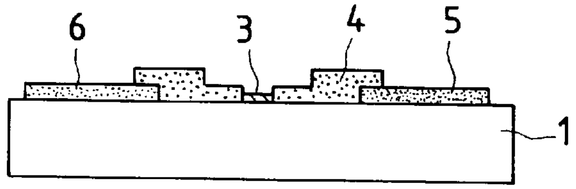

FIG. 3B shows a pulse voltage whose pulse height increases with time. In FIG. 3B, the pulse voltage has a width T1 and a pulse interval T2, which are between 1 and 10 microseconds and between 10 and 100 milliseconds respectively. The height of the triangular wave (the peak voltage for the electric forming operation) is increased at a rate of, for instance, 0.1 V per step in vacuum.

While a triangular pulse voltage is applied to the device electrodes to form an electron-emitting region in an electric forming operation in the above description, the pulse voltage may have a different waveform such as a rectangular form and the pulse width and the pulse interval may be of values other than those cited above so long as they meet the requirements for successfully producing an electron-emitting region.

An electron-emitting device prepared through the above steps emits electrons from its electron-emitting region 3 when a voltage is applied to the thin film including an electron-emitting region to cause an electric current to flow on the surface of the device.

The present invention is characterized by the step of forming a thin film having an area for forming an electron-emitting region (Step b) that has a rigorously controlled thickness which satisfactorily conforms to a specified value. This will be described below in greater detail.

It should be noted here that variations in the thickness of the thin film including an electron-emitting region observed in electron-emitting devices manufactured by a known method mainly reflect the uneven profile of the film of an organic metal compound formed on the substrate by applying the compound by means of a spinner.

A thin film of an organic metal compound applied to a substrate can be easily crystallized as the solvent containing the compound volatizes off as vapor but the crystallized compound has heavily crystallized portions and poorly crystallized portions to show an uneven profile. In the subsequent baking step, although the organic metal compound is molten and spread over the entire surface of the substrate to reduce the uneven profile, the profile is however not completely corrected and the unevenness in the film height can give rise to an uneven distribution of electric resistance of the final product.

Additionally, if the mixture or the complex applied to the substrate can be easily sublimated as in the case of a mixture or complex of a metal carboxylate and an amine, it will be sublimated before it is decomposed during the baking operation to significantly reduce the film thickness on the substrate. Again, such a reduced film thickness can give rise to undesired changes in the electric resistance of the final product.

Finally, an uneven profile of one or more than one components of the device other than the applied thin film, namely the substrate and/or the electrodes, can adversely affect the applied thin film particularly in terms of its thickness and electric resistance in the final product.

Any known methods for forming a thin film having an area for forming an electron-emitting region cannot rigorously control the thickness of the thin film to make it satisfactorily conform to a specified value.

Contrary to this, by a method according to the invention, a material containing an organic metal compound is deposited on a substrate which is heated to a temperature higher than the decomposition temperature of the compound by CVD to form an amorphous or crystalline thin film of the material inclusive of an area for an electron-emitting region so that the film shows an even thickness and an even distribution of electric resistance. Thus, a thin film formed by a method according to the invention is not comparable by any means to a thin film produced by any known method.

Additionally, in a method of manufacturing an electron-emitting device according to the invention, the location and the rate of the emission current of the electron-emitting region is automatically defined by the location of the thin film including the electron-emitting region. Therefore, the location of thin film including the electron-emitting region relative to the device electrodes needs to be rigorously controlled for the purpose of the present invention.

According to another aspect of the invention, a thin film forming an electron-emitting region is produced on a substrate by forming a layer having a predetermined pattern of a sublimatable compound that can be chemically changed to the material of the thin film on a substrate by means of a technique referred to as sublimation transfer and then chemically changing the sublimatable compound to the material of the thin film for forming an electron-emitting region.

For the purpose of the present invention, any sublimatable compound can be used if it can eventually be chemically changed into the material of the thin film including an electron-emitting region, regardless if it is an organic compound or an inorganic compound. However, organic metal compounds constitute desirable candidates because they normally can produce the metal-containing material of the thin film for forming an electron-emitting region simply through baking.

Note that the metals of organic metal compounds and the ligands of complexes listed above can also be used with the technique of sublimatable transfer as defined herein for the purpose of the invention.

For instance, a mixture or complex of a metal acetate and an amine can be gasified at relatively low temperature and with a relatively low degree of vacuum. Therefore such a mixture or complex can provide a sublimatable organic metal compound.

For the purpose of the present invention, the operation of sublimation transfer is carried out onto a substrate from an original pattern having a sublimation layer, which may contain an appropriate binding agent in addition to a sublimatable compound. If the binding agent has a self-preserving ability, the substrate of the original pattern may be omitted.

Materials that can be used for the substrate of an original pattern include metal, plastic and paper of any known types.

Materials that can be used for the binding agent include cellulose esters such as cellulose nitrate, cellulose acetate, cellulose propionate, methylcellulose, ethylcellulose and butylcellulose, vinyl resins such as polystyrene, polyvinylchloride, polyvinylacetate, polyvinylbutyral, polyvinylalcohol, polyvinylpyrrolidone and polyvinylacetal, acrylic resins such as polymethylmethacrylate, polybutylacrylate, polyacrylamide and polyacrylnitrile, polyolefins such as polyethylene and polypropylene, polyesters such as polyethyleneterephthalate, polyacrylate resins, polyamides, polyimides, epoxy resins, phenol resins and natural high molecular compounds such as gelatin.

Now, a method of manufacturing an electron-emitting device according to another aspect of the invention will be described by referring to FIGS. 4A through 4E. Such a device is typically illustrated in FIGS. 1A and 1B. Note that Steps a through e described below correspond to illustrations FIGS. 4A through 4E respectively.

Step a: After thoroughly cleaning a substrate 1 with pure water and an organic solvent, a pair of device electrodes 5, 6 are formed on the insulating substrate 1 by an appropriate means such as vacuum deposition or photolithography. While the device electrodes may be made of any highly electroconductive material, preferred candidate materials include metals such as Ni, Cr, Au, Mo, W, Pt, Ti, Al, Cu and Pd and their alloys.

Steps b and c: An original pattern 8 comprising a substrate 9*a* and a sublimation layer 9*b* is tightly placed on the substrate 1 carrying the device electrodes 5, 6 and the patterned sublimatable compound of the sublimation layer is transferred from the original pattern 8 onto the substrate 1 by applying heat thereto, using an appropriate means such as a thermal head 10, in such a way that the transferred pattern of the compound makes a thin film 7 bridging the device electrodes 5, 6.

The pattern to be transferred may be of any desired shape such as square or round and have dimensions between several to tens of several millimeters if a thermal head is used, although the dimensions vary as a function of the heat applying means to be used for the pattern transfer.

The means for heating the original pattern is not limited to a resistance-heater such as a thermal head. Alternatively, pattern transfer can be realized by using a material containing a light absorbing substance such as a light absorbing pigment for the original pattern and causing a laser beam to scan the pattern. Heat is preferably applied to the original pattern tightly laid on the insulating substrate. In order for heat to be applied exactly to follow a given pattern, the resistance-heater or the laser beam emitter needs to be frequently turned on and off while it is scanning the original pattern.

The temperature at which the original pattern is heated for pattern transfer is preferably found within a range where the sublimatable compound is sublimated and the binding agent or the light absorbing substance contained in the original pattern is not adversely affected for pattern transfer. It is also preferably above the glass transition temperature and below the melting point of the binding agent contained in the original pattern. If the temperature is lower than the glass transition temperature of the binding agent, the sublimatable compound can hardly be sublimated and, if the binding agent is heated above its melting point, it would not easily adhere to the insulating substrate that carries the device electrodes.

The temperature range to be defined for the pattern transfer operation can be modified by selecting an appropriate binding agent. The operation of sublimation transfer can be conducted under reduced pressure if the sublimation temperature of the sublimatable compound is close to its thermal decomposition temperature.

The temperature of the heated original pattern can be controlled by controlling the power supplied to the resistance-heater or the intensity of the beam of light irradiating the original pattern. Additionally, if the resistance-heater or the beam of light irradiating the original pattern is moved on or above the original pattern, the above temperature can also be controlled by controlling the moving speed of the heater or the scanning speed of the beam of light. Still additionally, the temperature of the heated original pattern can be controlled by selecting a timing for removing the original pattern from the substrate carrying thereon the device electrodes after heat has been applied thereto.

Finally, the total amount of the sublimatable compound transferred to the substrate and hence the thickness of the thin film for forming an electron-emitting region to be produced on the substrate can be controlled by controlling the amount of heat applied to the original pattern or the glass transition temperature of the binding agent.

Step d: The thin film 7 for forming an electron-emitting region made of the transferred sublimatable compound is baked to show a profile conforming to the designed pattern.

Step e: A voltage is applied to the device electrodes 5, 6 from a power source (not shown) to carry out an operation of electrically energizing the thin film which is also called an electric forming operation in order to partly change the structure of the thin film and produce an electron-emitting region 3. The produced electron-emitting region 3 may comprise fine particles of metal.

An electron-emitting device prepared by following the above described steps emits electrons from the electron-emitting region 3 when a voltage is applied to the thin film for forming the electron-emitting region to cause an electric current to run along the surface of the device.

With the above described method of manufacturing an electron-emitting device according to the invention obviously comprises by far fewer steps than the known method describe earlier by referring to FIGS. 11A through 11K.

More specifically, while Steps b through j of the known method of FIGS. 11A through 11K are dedicated to the operation of forming a thin film 2 for forming an electron-emitting region and having an intended pattern, the above described method according to the present invention requires only three steps, or Steps b through d, for the same operation.

Additionally, since the above described method according to the invention does not involve photolithography nor dry etching for the operation of patterning the thin film for forming an electron-emitting region, the device can be produced at significantly reduced cost. The fact that the method uses a reduced amount of solvent makes it particularly friendly to the environment.

Finally, since the thickness of the thin film for forming an electron-emitting region can be rigorously controlled, the electron-emitting performance of a large display comprising a number of electron-emitting devices can constantly be held under control.

The performance of an electron-emitting device manufactured by a method according to the invention can be evaluated by means of a gauging system as described below by referring to FIG. 5.

Figure 1B:
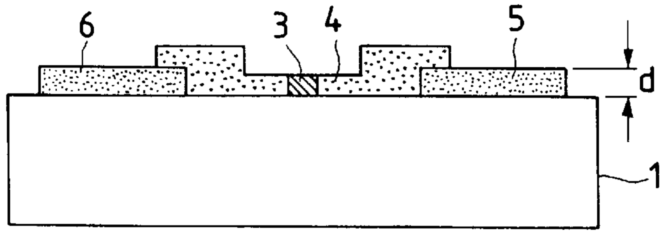
Figure 2A:
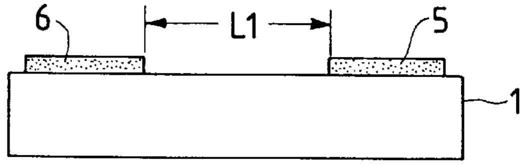
FIGS. 2A, 2B and 2C are schematic side views of an electron-emitting device manufactured by a method according to the invention in Example 1, showing different manufacturing steps.
Figure 2B:
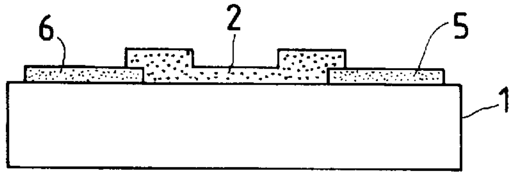
Figure 2C:
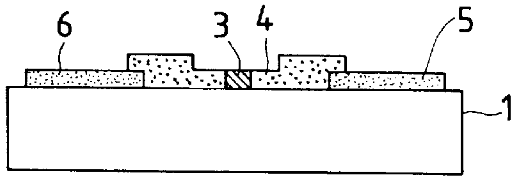
Figure 5:
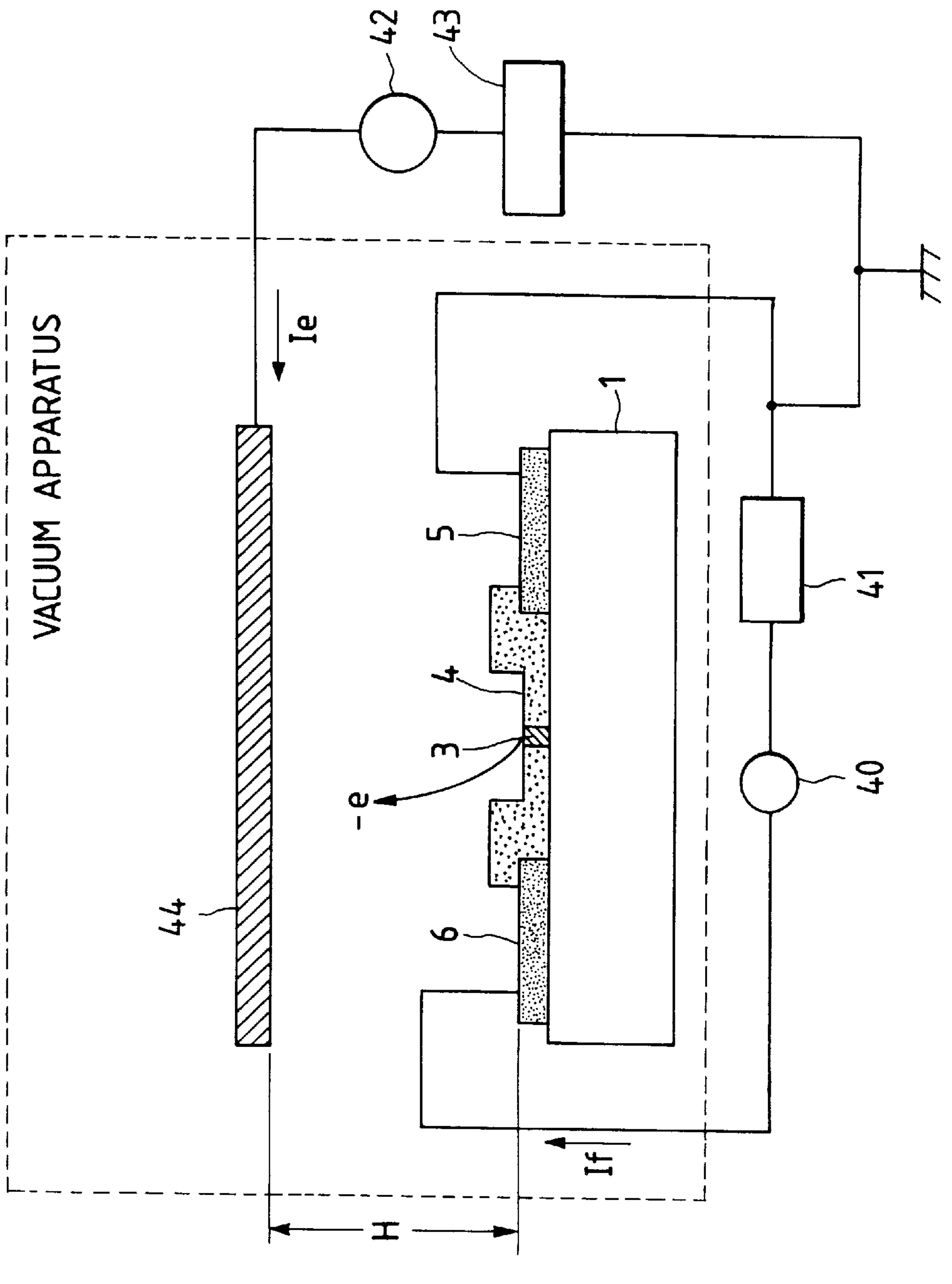
FIG. 5 is a block diagram of a gauging system for determining the performance of a surface-conduction type electron-emitting device.

FIG. 5 is a schematic block diagram of a gauging system for determining the performance of an electron emitting device having a configuration as shown in FIGS. 1A and 1B.

In FIG. 5, reference numeral 1 denotes an insulating substrate and reference numerals 5 and 6 denote a pair of device electrodes while reference numerals 4 and 3 respectively denotes a thin film including an electron-emitting region and the electron-emitting region per se. Otherwise, the gauging system comprises a power source 41 for applying a device voltage Vf to the device, an ammeter 40 for metering the device current If running through the thin film 4 including the electron-emitting section between the device electrodes 5 and 6, an anode 44 for capturing emission current Ie emitted from the electron-emitting region of the device, a high voltage source 43 for applying a voltage to the anode 44 and another ammeter 42 for metering the emission current Ie emitted from the electron-emitting region 3 of the device. For measuring the device current If and the emission current Ie, the device electrodes 5 and 6 are connected to the power source 41 and the ammeter 40 and the anode 44 is placed above the device and connected to the high voltage source 43 and the ammeter 42. The electron emitting device to be tested and the anode 44 are put into a vacuum chamber, which is provided with an exhaust pump (not shown) so that the metering operation can be conducted under a desired vacuum condition. The exhaust pump (not shown) comprises a turbo pump and a rotary pump and, if an ultrahigh degree of vacuum is required, an ion pump may also be installed. A heater (not shown) is also provided to heat the device and the vacuum chamber.

For determining the performance of the device, a voltage between 1 and 10 kV is applied to the anode 35, which is spaced apart from the electron-emitting device by distance H which is between 2 and 8 mm.

Figure 6:
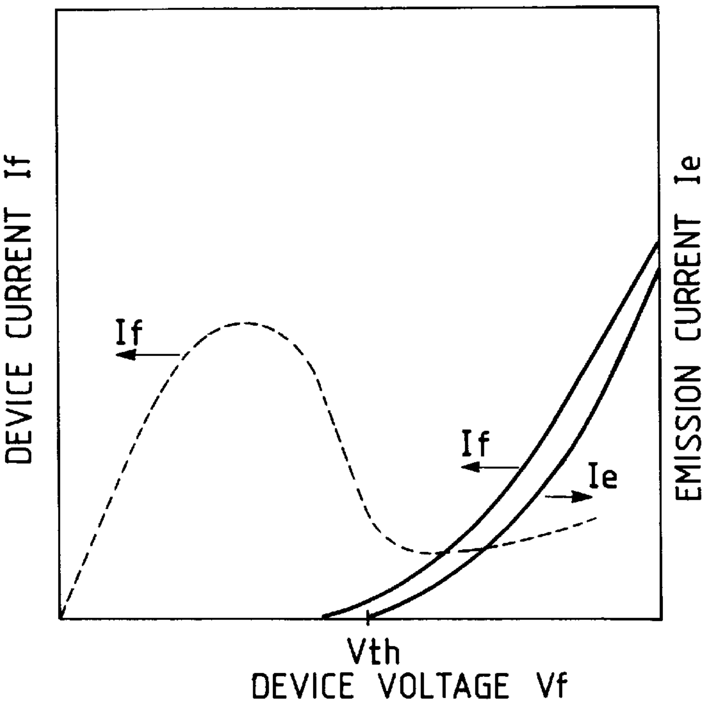
FIG. 6 is a graph showing the relationship between the device voltage and the device current as well as the relationship between the device voltage and the emission current of a surface conduction electron-emitting device manufactured by a method according to the invention.

FIG. 6 shows a graph schematically illustrating the relationship between the device voltage Vf and the emission current Ie and the device current If typically observed by a gauging system as shown in FIG. 5 when the variables are found within ordinary operating ranges. Note that different units are arbitrarily selected for Ie and If in FIG. 6.

As seen in FIG. 6, an electron-emitting device to be suitably used for the purpose of the invention has three remarkable features in terms of emission current Ie, which will be described below.

Firstly, an electron emitting device of the type under consideration shows a sudden and sharp increase in the emission current Ie when the voltage applied thereto exceeds a certain level (which is referred to as a threshold voltage hereinafter and indicated by Vth in FIG. 6), whereas the emission current Ie is practically unobservable when the applied voltage is found lower than the threshold value Vth. Differently stated, an electron-emitting device of the above identified type is a non-linear device having a clear threshold voltage Vth to the emission current Ie.

Secondly, since the emission current Ie is highly dependent on the device voltage Vf, the former can be effectively controlled by way of the latter.

Thirdly, the emitted electric charge captured by the anode 44 is a function of the duration of time of applying the device voltage Vf. In other words, the amount of electric charge captured by the anode 44 can be effectively controlled by the time during which the device voltage Vf is applied.

On the other hand, the device current If of an electron-emitting device of the type under consideration may show a monotonically increasing characteristic (hereinafter referred to as MI characteristic) (as indicated by a solid line in FIG. 6) and/or a voltage-controlled negative resistance characteristic (hereinafter referred to as VCNR characteristic) (as indicated by a broken line in FIG. 6) relative to the device voltage Vf depending on the method selected for manufacturing the device.

It has been discovered that the VCNR characteristic of the device current If becomes apparent in an electron-emitting device of the type under consideration when it is subjected to an electric forming operation in an ordinary vacuum system and the characteristic varies remarkably as a function of a number of factors including the electric conditions of the electric forming process, the vacuum conditions of the vacuum system, the vacuum and electric conditions of the gauging system particularly when the performance of the electron-emitting device is gauged in the vacuum gauging system after the electric forming process (e.g., the sweep rate at which the voltage being applied to the electron-emitting device is swept from low to high in order to determine the current-voltage characteristic of the device) and the duration of time for the electron-emitting device to have been left in the vacuum system before the gauging operation. At the same time, the emission current Ie shows the MI characteristic.

Because of the above described characteristic features of a surface conduction electron-emitting device of the above identified type, the performance of electron emission of an electron source or an image-forming apparatus prepared by arranging a large number of such devices can be controlled easily and surely as a function of the input signal so that such a device may find a variety of applications in various technological fields.

An electron source or an image-forming apparatus can be realized by arranging on a substrate a large number of electron-emitting devices manufactured by a method according to the invention. This will be described in detail below.

Electron-emitting devices may be arranged on a substrate in a number of different ways. For instance, a number of surface conduction electron-emitting devices as described earlier by referring to a coventional manufacturing method may be arranged in rows along a direction (hereinafter referred to row-direction), each device being connected by wirings at opposite ends thereof, and driven to operate by control electrodes (hereinafer referred to as grids or modulation means) arranged in a space above the electron-emitting devices along a direction perpendicular to the row direction (hereinafter referred to as column-direction) or, alternatively, as will be described below, a total of m X-directional wirings and a total of n Y-directional wirings are arranged with an interlayer insulation layer disposed between the X-directional wirings and the Y-directional wirings along with a number of surface conduction electron-emitting devices such that the pair of device electrodes of each surface conduction electron-emitting device are connected respectively to one of the X-directional wirings and one of the Y-directional wirings. The latter arrangement is referred to as a simple matrix arrangement. Now, the simple matrix arrangement will be described in detail.

In view of the three basic features of a surface conduction electron-emitting device according to the invention, each of the surface conduction electron-emitting devices having a simple matrix arrangement configuration can be controlled for electron emission by controlling the wave height and the pulse width of the pulse voltage applied to the opposite electrodes of the device above the threshold voltage level. On the other hand, the device does not emit any electron below the threshold voltage level. Therefore, regardless of the number of electron-emitting devices, desired surface conduction electron-emitting devices can be selected and controlled for electron emission in response to the input signal by applying a pulse voltage to each of the selected devices.

Now, an electron source substrate realized on the basis of the above concept will be described by referring to FIG. 7.

Figure 7:
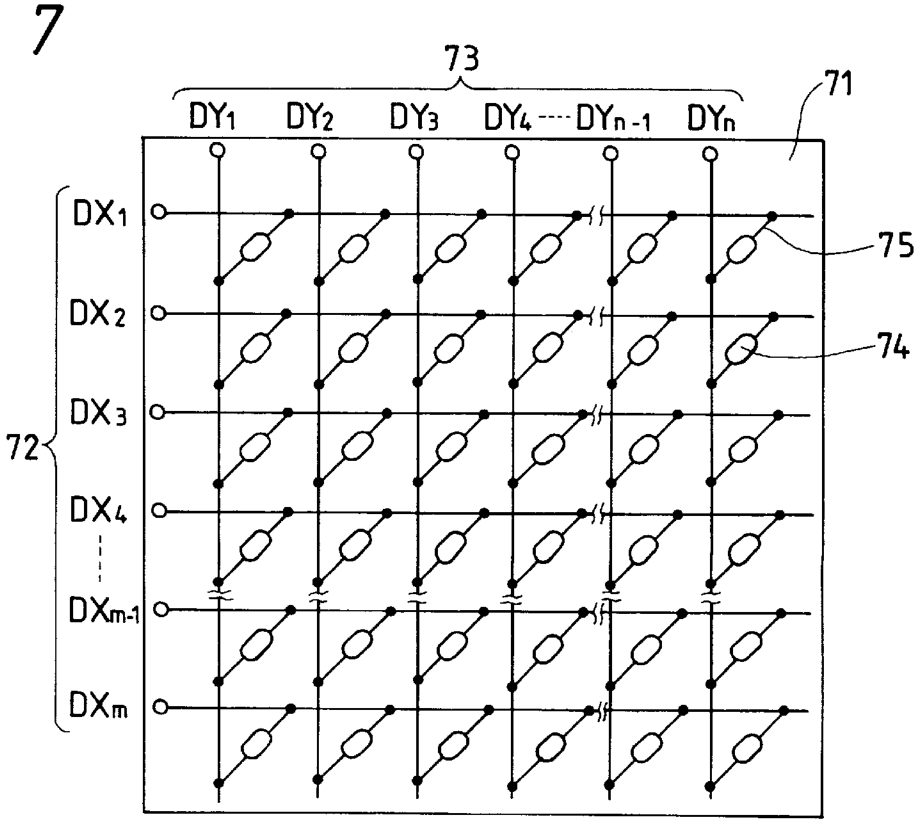
FIG. 7 is a schematic plan view of an electron source realized by arranging a large number of electron-emitting devices manufactured by a method according to the invention, showing in particular the simple matrix configuration of the substrate.

FIG. 7 is a schematic plan view of the substrate of an electron source realized by using a number of electron-emitting devices manufactured by a method according to the invention and arranged into a simple matrix. In FIG. 7, the electron source comprises an insulating substrate 71 such as a glass substrate, whose dimensions including the thickness are determined as a function of the number and profile of the electron-emitting devices arranged thereon and, if the electron source constitutes part of a container in operation, the requirements that need to be met in order to keep the inside of the container under a vacuum condition.

There are provided on the insulating substrate 71 a total of m X-directional wirings 72, which are donated by DX1, DX2, . . . , DXm and made of a conductive metal formed by vacuum deposition, printing or sputtering. These wirings are so designed in terms of material, thickness and width that, if necessary, a substantially equal voltage may be applied to the electron-emitting devices. A total of n Y-directional wirings 73 donated by DY1, DY2, . . . , DYn are also provided. They are made of a conductive metal also formed by vacuum deposition, printing or sputtering and similar to the X-directional wirings in terms of material, thickness and width so that a substantially equal voltage may be applied to the electron-emitting devices. An interlayer insulation layer (not shown) is disposed between the m X-directional wirings and then n Y-directional wirings to electrically isolate them from each other, the m X-directional wirings and n Y-directional wirings forming a matrix. Note that m and n are integers. The interlayer insulation layer (not shown) is typically made of $SiO_2$.

The oppositely arranged device electrodes (not shown) of each of the electron-emitting devices 74 are electrically connected to the related one of the m X-directional wirings 72 and the related one of the n Y-directional wirings 73 by respective connecting wires 75 which are made of a conductive metal and formed by vacuum deposition, printing or sputtering.

The electron-emitting devices 74 are simultaneously formed on the insulating substrate 71 by a manufacturing method according to the invention in such a way that their thin films including respective electron-emitting regions show a predetermined pattern.

The X-directional wirings 82 are electrically connected to a scan signal generating means (not shown) for applying a scan signal to a selected row of electron-emitting devices 84 and scanning the selected row.

On the other hand, the Y-directional wirings 83 are electrically connected to a modulation signal generating means (not shown) for applying a modulation signal to a selected column of electron-emitting devices 84 and modulating the selected column.

Note that the drive signal to be applied to each electron-emitting device is expressed as the voltage difference of the scan signal and the modulation signal applied to the device. Also note that while the above described electron source is realized in the form of a simple matrix of electron-emitting devices, it may be realized in many different ways. For example, a ladder arrangement where electron-emitting devices are disposed between any two adjacent ones of a number of wirings arranged in parallel may provide a possible alternative.

Figure 8:
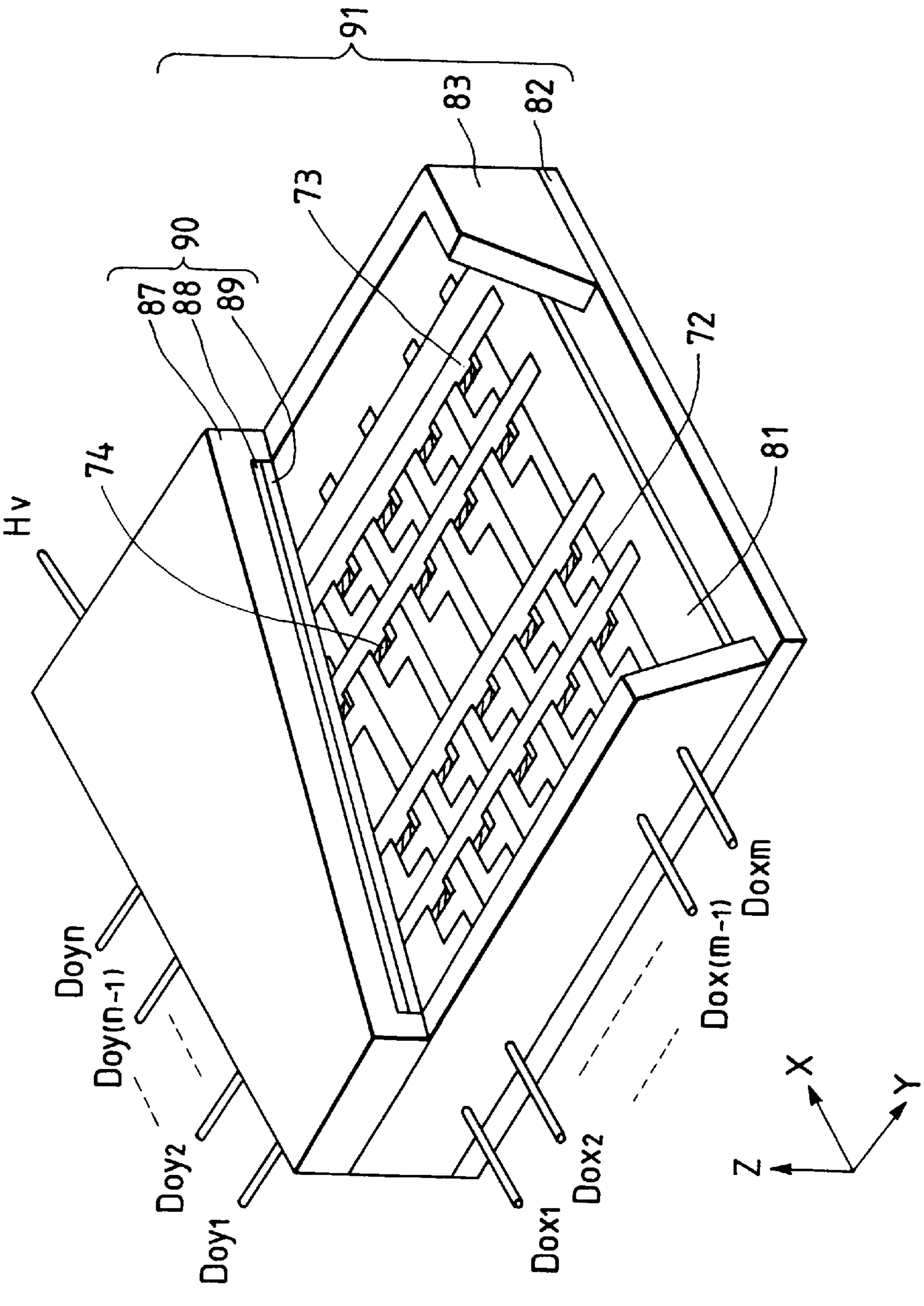
FIG. 8 is a partially cutaway schematic perspective view of an image-forming apparatus manufactured by a method according to the invention.

Now, an image-forming apparatus according to the invention and comprising an electron source having a simple matrix arrangement as described above will be described by referring to FIGS. 8, 9A and 9B, of which FIG. 8 illustrates the basic configuration of the image-forming apparatus and FIGS. 9A and 9B show two alternative patterns that can be used for the image-forming apparatus. Referring firstly to FIG. 8, the image-forming apparatus comprises an electron source 81 of the above described type carrying thereon a number of electron-emitting devices that have not been subjected to an electric forming operation, a rear plate 82 rigidly holding the electron source 81, a face plate 90 produced by laying a fluorescent film 88 and a metal back 89 on the inner surface of a glass substrate 87 and a support frame 83. An enclosure 91 is formed for the apparatus by assembling said rear plate 82, said support frame 83 and said face plate 90 and bonding them together with frit glass.

While the enclosure 91 is formed of the face plate 90, the support frame 83 and the rear plate 82 in the above description, the rear plate 82 may be omitted if the electron source 81 is strong enough by itself because the rear plate 82 is used mainly to reinforce the strength of the electron source 81. If such is the case, an independent rear plate 82 may not be required and the electron source 81 may be directly bonded to the support frame 83 so that the enclosure 91 is constituted of a face plate 90, a support frame 83 and an electron source 81. The overall strength of the enclosure 91 may be increased by arranging a number of support members called spacers (not shown) between the face plate 90 and the rear plate 82.

The fluorescent film 88 is made exclusively from phosphor if the apparatus is for displaying images in black and white, whereas it is made from phosphor 93 and a black conductive material 92 which may be referred to as black stripes or black matrix depending on the arrangement of fluorescent members of the film 88 made of phosphor. Black stripes or members of a black matrix are arranged for a color display panel so that the blurring of the phosphorous substances 93 of three different primary colors is made less recognizable and the adverse effect of reducing the contrast of displayed images of external light is weakened by blackening the surrounding areas. While graphite is normally used as a principal ingredient of the black stripes, other conductive material having low light transmissivity and reflectivity may alternatively be used.

A precipitation or printing technique is suitably used for applying phosphor on the glass substrate regardless of black and white or color display.

An ordinary metal back 89 is arranged on the inner surface of the fluorescent film 88. The metal back 95 is provided in order to enhance the luminance of the display panel by causing the rays of light emitted from the fluorescent bodies and directed to the inside of the enclosure to turn back toward the face plate 90, to use it as an electrode for applying an accelerating voltage to electron beams and to protect the phosphor against damages that may be caused when negative ions generated inside the enclosure collide with it. The metal back is prepared by smoothing the inner surface of the fluorescent film 85 (in an operation normally referred to as "filming") and forming an A1 film thereon by vacuum deposition after forming the fluorescent film. A transparent electrode (e (not shown)) may be formed on the face plate 90 facing the outer surface of the fluorescent film 88 in order to raise the conductivity of the fluorescent film 88.

Care should be taken to accurately align each set of pieces of phosphorous materials of the primary colors and a corresponding electron-emitting device, if a color display is involved, before the above listed components of the enclosure are bonded together.

The enclosure 91 is then evacuated by way of an exhaust pipe (not shown) to a degree of vacuum of approximately $10^{-6}$ Torr and hermetically sealed.

After evacuating the enclosure to a desired degree of vacuum by way of an exhaust pipe (not shown), a voltage is applied to the device electrodes of each device by way of external terminals Dox1 through Doxm and Doy1 through Doyn for an electric forming operation to finish the process of preparing electron-emitting devices 74 comprising respective electron-emitting regions. A getter operation may be carried out after sealing the enclosure 91 in order to maintain that degree of vacuum in it. A getter operation is an operation of heating a getter (not shown) arranged at a given location in the enclosure 91 immediately before or after sealing the enclosure 91 by resistance heating or high frequency heating to produce a vapor deposition film. A getter normally contains Ba as a principle ingredient and the formed vapor deposition film can typically maintain the inside of the enclosure to a degree of $1\times10^{-5}$ to $1\times10^{-7}$ Torr by its adsorption effect.

An image-forming apparatus according to the invention and having a configuration as described above is operated by applyilng a voltage to each electron-emitting device by way of the external terminals Dox1 through Doxm and Doy1 through Doyn to cause the electron-emitting devices to emit electrons. Meanwhile, a high voltage of greater than several kV is applied to the metal back 89 or the transparent electrode (not shown) by way of high voltage terminal Hv to accelerate electron beams and cause them to collide with the fluorescent film 88, which by turn is energized to emit light to display intended images.

While the configuration of a display panel to be suitably used for an image-forming apparatus according to the invention is outlined above in terms of indispensable components thereof, the materials of the components are not limited to those described above and other materials may appropriately be used depending on the application of the apparatus.

While the basic idea of the present invention is utilized to provide an image-forming apparatus for display applications in the above description, such an image-forming apparatus can also be used as an alternative source of fluorescent light that can replace the light emitting diodes of an optical printer comprising a photosensitive drum and light emitting diodes as principal components.

EXAMPLES

Now, the present invention will be described further by way of examples.

Example 1

To begin with, a specimen of electron-emitting device of the type as shown in FIGS. 1A and 1B was prepared. Namely, the specimen had a plan view and a sectional side view as shown in Figs. 1A and 1B respectively. Note that, in FIGS. 1A and 1B, L1 denotes the distance separating the device electrodes 5 and 6 and W1 and d respectively denote the width and thickness of the device electrodes while L2 and W2 respectively denote the length and the width of the thin film 4 including the electron-emitting region 3.

The specimen was formed, following the steps described below by referring to FIGS. 2A through 2C. Note that Steps a through c described below correspond to FIGS. 2A through 2C respectively.

Step a: A quartz substrate was used for the insulating substrate 1. After thoroughly cleansing the substrate 1 with an organic solvent, a pair of device electrodes 5, 6 of nickel (Ni) were formed on the surface of the substrate. The device electrodes were separated by a distance L1 equal to 3 μm and each of the electrodes had a width W1 and a thickness d equal to 500 m and 1,000 Å respectively.

Step b: A mixture of a 0.1 mol (22.49 g) of palladium acetate and a 0.1 mol (20.24 g) of di-n-propylamine was used for the organic metal compound to be used for the electron emitting device. The sublimation temperature and the decomposition temperature of the mixture are about 120° C. and 180° C. respectively under the atmospheric pressure.

The mixture was heated to 130° C. in a hermetically sealed vessel having a capacity of 3 liters to cause reaction of the palladium acetate and di-n-propyl amine to form an inorganic compound, which then sublimates. On the other hand, the insulating substrate 1 carrying thereon the device electrodes 5, 6 was heated to 300° C. within the vessel to cause the sublimated inorganic compound, which was palladium oxide, to settle on the surface of the substrate as fine particles to produce a film of fine particles of palladium oxide (having an average diameter of 70 Å) on the substrate, which became a thin film 2 for forming an electron-emitting region of the device. The fact that the fine particles w.ere palladium oxide was confirmed by X-ray analysis.

The thin film 2 for forming an electron-emitting region had a width W2 of 300 μm and arranged substantially at the middle of the device electrodes 5, 6. The thin film 2 for forming an electron-emitting region had a height d equal to 100 Å and an electric resistance per unit area equal to $5\times10^4$ Ω/□.

Step c: An electron-emitting region 3 was formed in the thin film 2 for forming an electron-emitting region by applying a voltage between the device electrodes 5, 6 for an electric energizing (forming) operation. FIG. 3A shows a graph of the voltage waveforms used for the electric forming operation of this example.

In FIG. 3A, T1 and T2 respectively denote the pulse width and the pulse interval of the applied pulse voltage, which were respectively 1 millisecond and 10 milliseconds for this example. The wave height (the peak voltage for the forming operation) of the applied triangular pulse voltage was 5 V and the operation was conducted for 60 seconds in vacuum of $10^{-6}$ Torr. It was found that fine particles containing palladium oxide as a principal ingredient were dispersed in the electron emitting region 3 of the device produced by following the above steps, the average diameter of the particles being 30 Å.

The prepared specimen of electron-emitting device was tested for its electron-emitting performance, using a gauging system as illustrated in FIG. 5.

The anode 44 and the electron-emitting device was separated by a distance H equal to 4 mm and the voltage of the node was 1 kV, the inside of the vacuum chamber of the system being evacuated to degree of vacuum of $1\times10^{-6}$ Torr for the performance test. FIG. 6 shows a graph of the current-voltage relationships similar to those of the specimen obtained by the test. In the case of the specimen, the emission current Ie showed an abrupt rise as the device voltage approached near 8 V. The device current If and the emission current Ie were respectively 2.2 mA and 1.1 μA when the device voltage reached 14 V to prove an electron emission efficiency η=Ie/If(%) of 0.05%.

Subsequently, a number of specimens were prepared in the same manner to see the dispersion in the emission current Ie among the specimens. It was proved that the dispersion was less than a half of its counterpart of electron-emitting devices prepared by a conventional manufacturing method.

Example 2

A specimen of electron-emitting device was prepared in a manner same as in Example 1 above except that a mixture of a 0.1 mol (24.88 g) of nickel acetate (4-hydrate) and a 0.2 mol (20.24 g) of triethylamine was used for the organic metal compound. The sublimation temperature and the decomposition temperature of the mixture are about 150° C. and 350° C. respectively under the atmospheric pressure. The mixture was preliminarily heated in an open vessel at 100° C. for 5 minutes to eliminate the water content of the crystalline nickel acetate and then heated to 150° C. in a hermetically sealed vessel having a capacity of 3 liters to cause reaction of the palladium acetate and triethylamine to form an inorganic compound, which then sublimates. Thereafter, the insulating substrate 1 carrying thereon the device electrodes 5, 6 was heated to 350° C. within a hermetically sealed vessel to cause the sublimated inorganic compound, which was nickel oxide, to settle on the surface of the substrate as fine particles to produce a film of fine particles of nickel oxide (having an average diameter of 70 Å) on the substrate, which became a thin film 2 for forming an electron-emitting region of the device. The fact that the fine particles were nickel oxide was confirmed by X-ray analysis.

Then, the specimen was subjected to an electric forming operation to produce a complete electron-emitting device as in the case of Example 1.

Subsequently, a number of specimens were prepared in the same manner to see the dispersion in the emission current Ie among the specimens. It was proved that the dispersion among the specimens was as small as that of Example 1.

Example 3

A specimen of electron-emitting device was prepared in a manner same as in Example 1 above except that a mixture of a 0.1 mol (17.73 g) of palladium chloride and a 0.2 mol (20.24 g) of di-n-propylamine was used for the organic metal compound. The sublimation temperature and the decomposition temperature of the mixture are about 120° C. and 180° C. respectively under the atmospheric pressure. The mixture was heated to 130° C. in a hermetically sealed vessel having a capacity of 3 liters to cause reaction of the palladium acetate and di-n-propyl amine to form an inorganic compound, which then sublimates. Thereafter, the insulating substrate 1 carrying thereon the device electrodes 5, 6 was heated to 300° C. within a hermetically sealed vessel to cause the sublimated inorganic compound, which was palladium oxide, to settle on the surface of the substrate as fine particles to produce a film of fine particles of palladium oxide (having an average diameter of 70 Å) on the substrate, which became a thin film 2 for forming an electron-emitting region of the device. The fact that the fine particles were palladium oxide was confirmed by X-ray analysis.

Then, the specimen was subjected to an electric forming operation to produce a complete electron-emitting device as in the case of Example 1.

Subsequently, a number of specimens were prepared in the same manner to see the dispersion in the emission current Ie among the specimens. It was proved that the dispersion among the specimens was as small as that of Example 1.

Example 4

In this example, an image-forming apparatus as shown in FIG. 8 was prepared, using an electron source realized by arranging a number of electron-emitting devices into a matrix as shown in FIG. 7.

Figure 12:
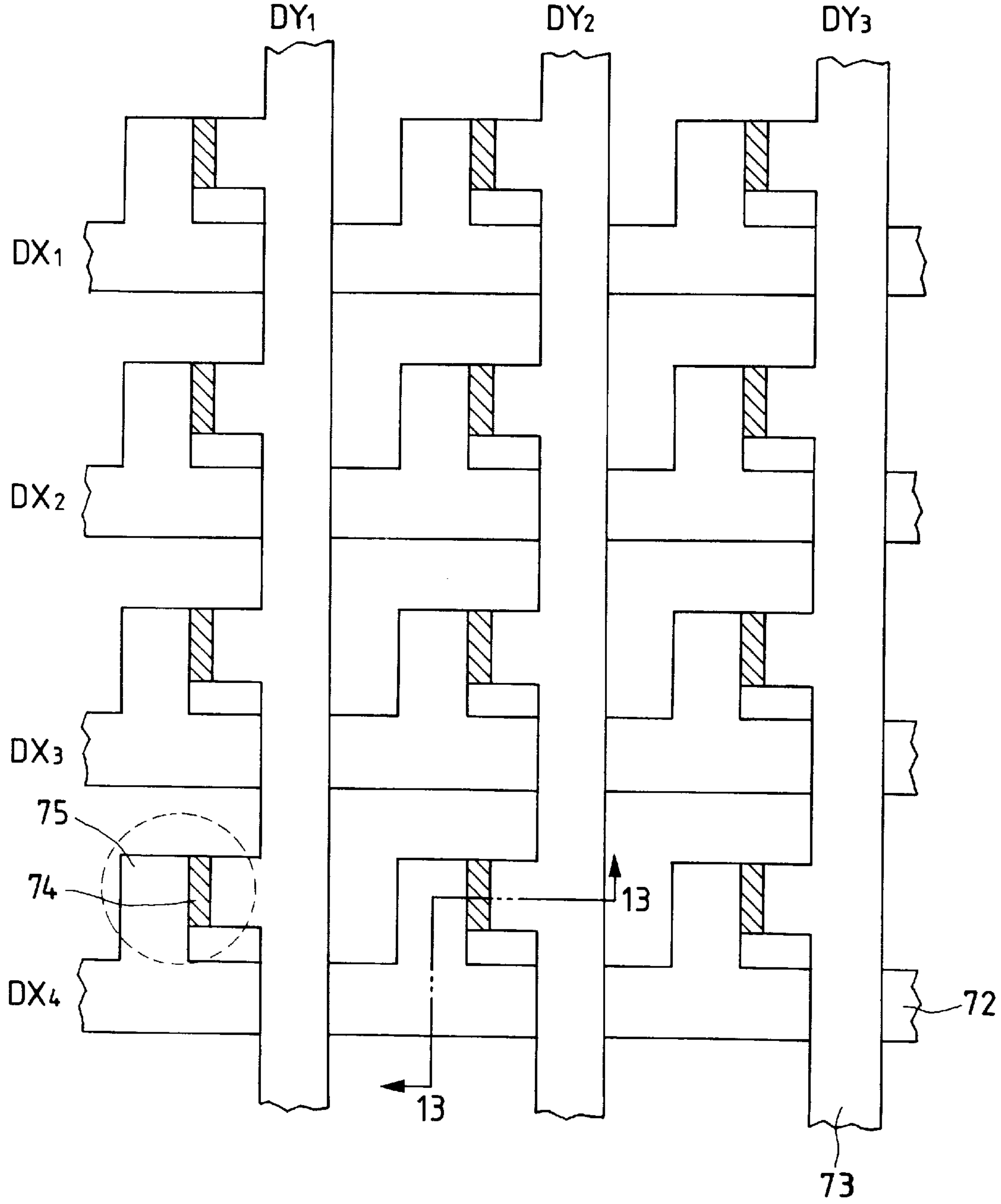
FIG. 12 is a schematic partial plan view of an electron source realized by using electron-emitting devices manufactured by a method according to the invention.
Figure 13:
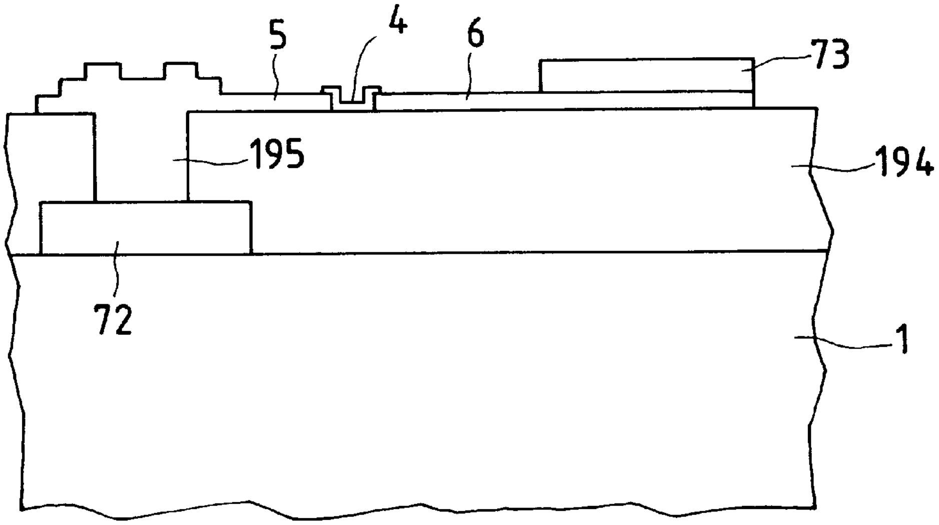
FIG. 13 is an enlarged schematic partial sectional side view of the electron source of FIG. 12 taken along line 13—13 in FIG. 12.

FIG. 12 shows a schematic partial plan view of the electron source and FIG. 13 shows a schematic partial sectional view taken along line 13—13 of FIG. 12. Note that same or similar components are respectively designated by same reference symbols in FIGS. 7, 12 and 13. In these drawings, 71 denotes a substrate and 72 and 73 respectively denote a plurality of X-directional wirings and a plurality of Y-directional wirings (which may be called lower and upper wirings respectively). Otherwise, the electron source comprises electron-emitting devices, each having a thin film 4 including an electron-emitting region and a pair of device electrodes 5 and 6, an interlayer insulation layer 194 and a number of contact holes 195, each of which is used to connect the device electrode 5 of a device with a related lower wiring 72.

Now, the steps of manufacturing an electron source and an image-forming apparatus incorporating such as electron source used in this example will be described in detail by referring to FIGS. 14A through 14H. Note that Steps a through h below correspond to FIGS. 14A through 14H respectively.

Step a: After thoroughly cleansing a soda lime glass plate, a silicon oxide film was formed thereon to a thickness of 0.5 microns by sputtering to produce a substrate 1, on which Cr and Au were sequentially laid by vacuum deposition to thicknesses of 50 Å and 6,000 Å respectively and then a photoresist (AZ1370: available from Hoechst Corporation) was formed by means of a spinner, while rotating the film, and baked. Thereafter, a photo-mask image was exposed to light and developed to produce a resist pattern for the lower wirings 72 and then the deposited Au/Cr film was wet-etched to produce lower wiring 72 having a desired profile.

Step b: A silicon oxide film was formed as an interlayer insulation layer 194 to a thckness of 1.0 μm by RF sputtering.

Step c: A photoresist pattern was prepared for producing contact holes 195 in the silicon oxide film deposited in Step b, which contact holes 195 were then actually formed by etching the interlayer insulation layer 194 using the photoresist pattern for a mask. RIE (Reactive Ion Etching) using $CF_4$ gas and $H_2$ gas was employed for the etching operation.

Step d: Thereafter, a pattern of photoresist (RD-2000N-41: available from Hitachi Chemical Co., Ltd.) was formed for pairs of device electrodes 5 and 6 and gaps G separating the respective pairs of electrodes and then Ti and Ni were sequentially deposited thereon respectively to thicknesses of 50 Å and 1,000 Å by vacuum deposition. The photoresist pattern was dissolved by an organic solvent and the Ni/Ti deposit film was treated by using a lift-off technique to produce pairs of device electrodes 5 and 6, each pair having a width W1 of 300 μm and separated from each other by a distance L1 of 20 μm.

Step e: After forming a photoresist pattern on the device electrodes 5, 6 for upper wirings 73, Ti and Au were sequentially deposited by vacuum deposition to respective thicknesses of 50 Å and 5,000 Å and then unnecessary areas were removed by means of a lift-off technique to produce upper wirings 73 having a desired profile.

Figure 15:
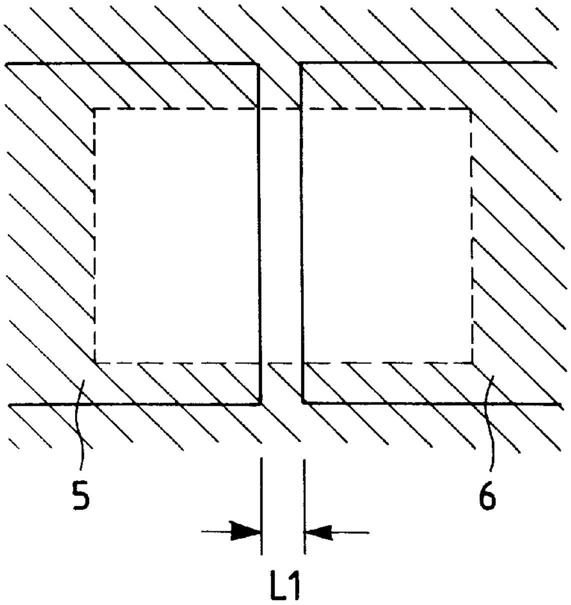
FIG. 15 is a schematic partial plan view of a mask that can be used for manufacturing the electron source of FIG. 12.
Figure 14A:
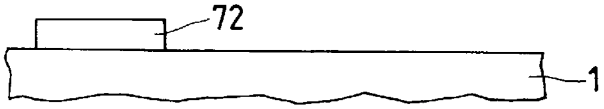
FIGS. 14A, 14B, 14C, 14D, 14E, 14F, 14G and 14H are schematic side views of the electron source of FIG. 12, showing different manufacturing steps.
Figure 14B:
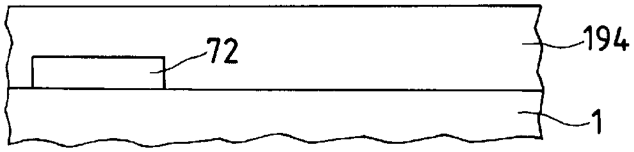
Figure 14C:
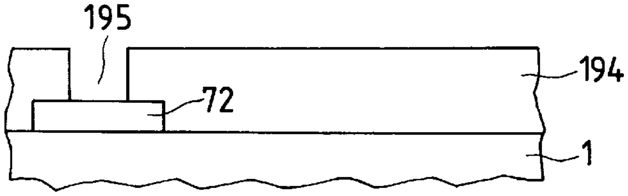
Figure 14D:
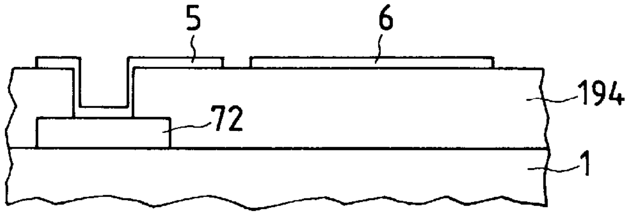
Figure 14E:
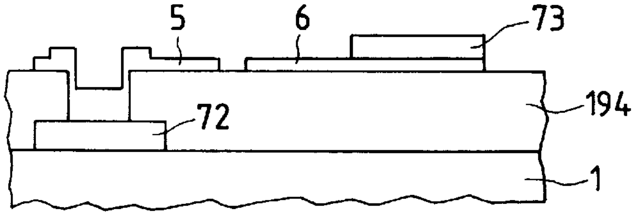
Figure 14F:
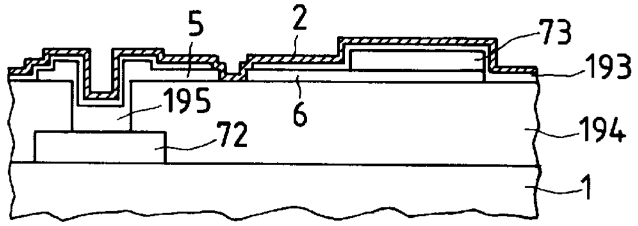
Figure 14G:
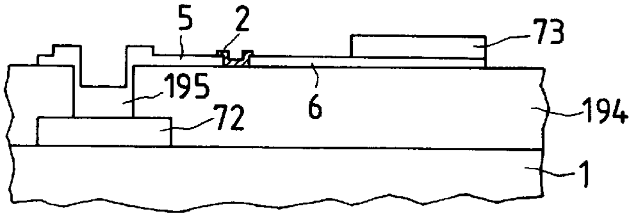
Figure 14H:
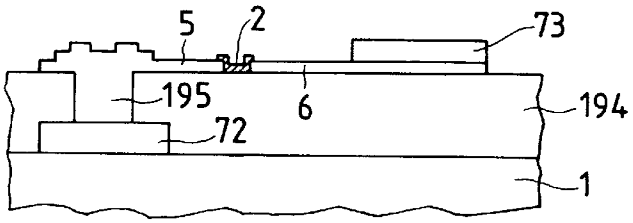
Figure 16:
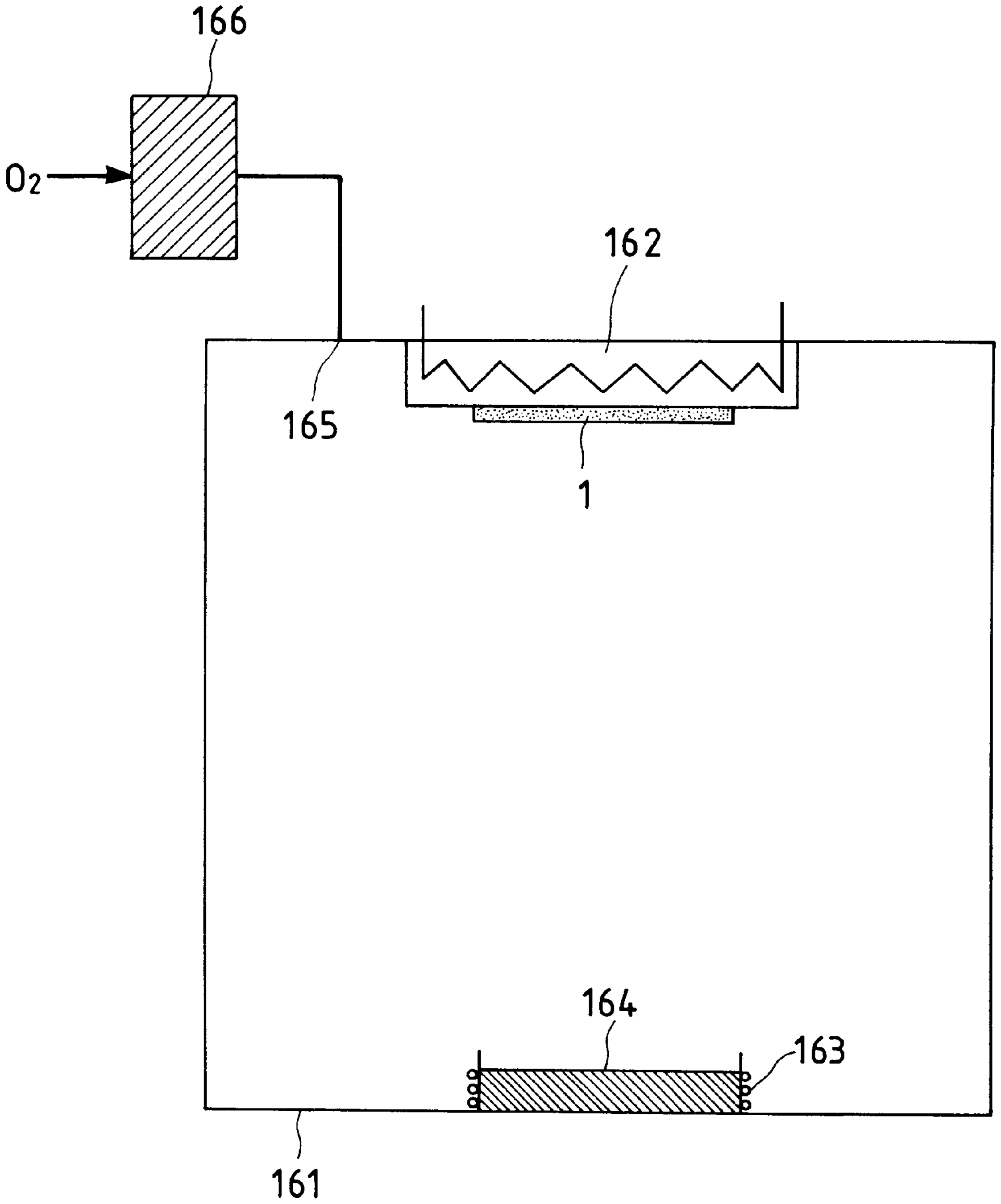
FIG. 16 is a schematic view of the atmospheric pressure CVD system as employed to prepare an electron source in Example 4.

Step f: FIG. 15 shows a schematic partial plan view of the mask used in this step for producing thin films 2, each for forming an electron-emitting region, of the electron-emitting devices of the electron source. The mask had an opening for producing the gap L1 separating the device electrodes and its vicinity for each device. The mask was used to form a Cr film 193 to a film thickness of 1,000 Å by vacuum deposition, which was then subjected to a patterning operation. Thereafter, fine particles were formed to produce thin films, each for forming an electron-emitting region, in an atmospheric pressure CVD system as shown in FIG. 16.

The CVD system used in this step had a configuration as described below. It comprises a chamber 161 containing in its upper area a substrate holder 162 for securing holding a substrate 1 by appropriate means (not shown) such as clamps with the film forming surface facing downward. The substrate holder 162 is provided with a heater and a thermocouple (not shown) to control the heater in such a way that the temperature of the substrate is constantly held to 300° C. A solution tank 164 provided with a surrounding heater 163 and a thermocouple (not shown) is arranged in a lower area of the chamber 161. The tank contained an organic palladim compound (ccp4230: available from Okuno Pharmaceutical Co., Ltd.) for this step. Otherwise, several gas inlet ports 165 are arranged around the substrate holder 162 so that $O_3$ gas may be introduced into the chamber therethrough (although only a single port is shown in FIG. 16). $O_3$ can be produced from $O_2$ by means of an ozonizer 166.

For forming films of fine particles, the temperature of the heater 163 was raised to 80 to 100° C. and $O_3$ was introduced into the chamber through the gas inlet ports 165 until the organic palladium was decomposed on the substrate 1 heated to 300° C. to produce fine particles containing palladium oxide as a principal ingredient.

The formed thin films 2 of fine particles had a film thickness of 100 Å and an electric resistance per unit area of $5\times10^4$ Ω/□±5–6%.

Note that the term "a fine particle film" as used herein refers to a thin film constituted of a large number of fine particles that may be loosely dispersed, tightly arranged or mutually and randomly overlapping (to form an island structure under certain conditions). The diameter of fine particles to be used for the purpose of the present invention is that of recognizable fine particles arranged in any of the above described states.

Step g: The Cr films 193 were removed by means of a lift-off technique to produce thin films 2 arranged to a designed pattern, each for forming an electron-emitting region.

Step h: Then, a pattern for applying photoresist to the entire surface area except the contact holes 195 was prepared and Ti and Au were sequentially deposited by vacuum deposition to respective thicknesses of 50 Å and 5,000 Å. Any unnecessary areas were removed by means of a lift-off technique to consequently bury the contact holes 195.

Now, lower wirings 72, an interlayer insulation layer 194, upper wirings 73, pairs of device electrodes 5 and 6 and thin films 2 were produced on the insulating substrate 1.

Then, an image-forming apparatus incorporating the electron source that had not been subjected to an electric forming process was prepared. This will be described below by referring to FIGS. 8 to 9B.

The electron source 81 that had not been subjected to an electric forming process was rigidly fitted to a rear plate 82 and thereafter a face plate 90 (prepared by forming a fluorescent film 88 and a metal back 89 as image-forming members on the inner surface of a glass substrate 103) was arranged 5 mm above the electron source 81 by interposing a support frame 83 therebetween. Frit glass was applied to junction areas of the face plate 90, the support frame 83 and the rear plate 82, which were then baked at 400° C. for 10 minutes in the atmosphere and bonded together to a hermetically sealed condition (FIG. 8), The electron source 81 was also firmly bonded to the rear plate 82 by means of frit glass.

Figure 9A:
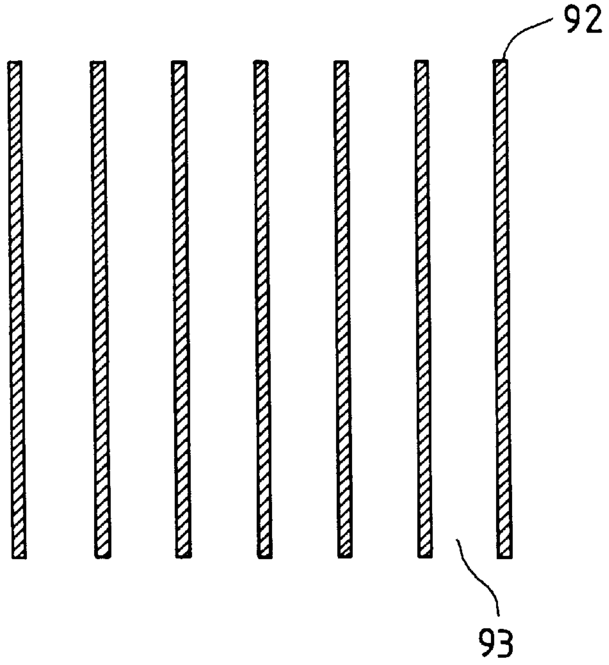
FIGS. 9A and 9B are schematic illustration, showing two possible alternative fluorescent films that can be used for an image-forming apparatus to be manufactured by a method according to the invention.
Figure 9B:
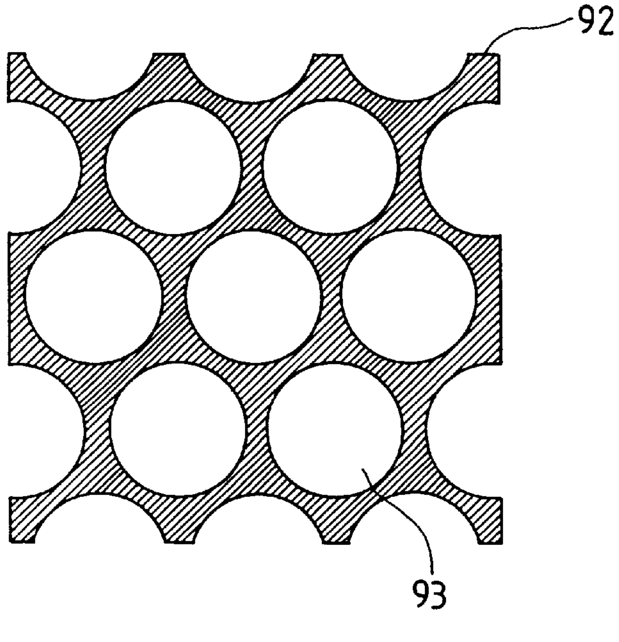

While the fluorescent film 88 which is an image-forming member may be solely made of phosphor if the image-forming apparatus is for displaying black and white images, firstly black stripes were arranged and then the gaps separating the black stripes were filled with respective phosphorous substances for primary colors to produce a fluorescent film 88 for this example (FIGS. 9A and 9B). The black stripes were made of a popular material containing graphite as a principal ingredient. The phosphorous substances were applied to the glass substrate 103 by using a slurry method.

A metal back is normally arranged on the inner surface of the fluorescent film 88. In this example, a metal back was prepared by producing an A1 film by vacuum deposition on the inner surface of the fluorescent film 88 that had been smoothed (in a so-called filming process). The face plate 90 may be additionally provided with transparent electrodes arranged close to the outer surface of the fluorescent film 88 in order to improve the electric conductivity of the fluorescent film 88, no such electrodes were used in this example because the metal back proved to be sufficiently conductive. The stripes of the phosphorous substances were carefully aligned with the respective electron-emitting devices before the above described bonding operation.

The prepared glass container was then evacuated by means of an exhaust pipe (not shown) and an exhaust pump to achieve a sufficient degree of vacuum inside the container. Thereafter, the thin film of each of the electron-eimitting devices arranged on the substrate was subjected to an electric forming operation, where a voltage was applied to the device electrodes of the electron-emitting devices by way of the respective external terminals Dox1 through Doxm and Doy1 through Doyn to produce an electron-emitting region in each thin film as in the case of Example 1.

Thereafter, the enclosure was completely sealed by heating, melting and closing the exhaust pipe (not shown) in vacuum of a degree of approximately $1\times10^{-6}$ Torr.

Finally, a getter operation was carried out on the apparatus in order to maintain a high degree of vacuum within the enclosure.

The electron-emitting devices of the prepared image-forming apparatus were then caused to emit electrons by applying a drive voltage thereto through the external terminals Dox1 through Doxm and Doy1 through Doyn and the emitted electrons were accelerated by applying a high voltage of several kV to the metal back 89 via the high voltage terminal Hv so that they collides with the fluorescent film 88 until the latter was energized to emit light and produce images. No uneven distribution of brightness nor existence of dark spots due to uneven distribution of fine palladium particles was observed on the display screen.

Comparative Example 1

An electron source was prepared as in Example 4 above except that the step of forming thin films for forming electron-emitting regions (Step f) was conducted as follows.

Step f: The mask of FIG. 15 was used to form a Cr film 193 to a film thickness of 1,000 Å by vacuum deposition, which was then subjected to a patterning operation. Thereafter, an organic palladium compound (ccp4230: available from Okuno Pharmaceutical Co., Ltd.) was applied thereto by means of a spinner, while rotating the film, and baked at 300° C. for 10 minutes. While each thin film 2 including an electron-emitting region produced in this step was made of fine particles containing palladium as a principal ingredient and had a film thickness of about 100 Å, it showed an electric resistance per unit area of $5\times10^4$ Ω/□±7–6%. This relatively poor achievement was mainly attributable to the undulated film surface of the produced thin film and/or the uneven application of organic palladium compound by the spinner.

A display apparatus was prepared, using the above electron source that had not been subjected to an electric forming operation, and then made to emit electrons. It showed a slightly uneven distribution of brightness because of dispersed performances of the electron-emitting devices.

Example 5

An electron source was prepared as in Example 4 above except that the step of forming thin films for forming electron-emitting regions (Step f) was conducted as follows.

Figure 17:
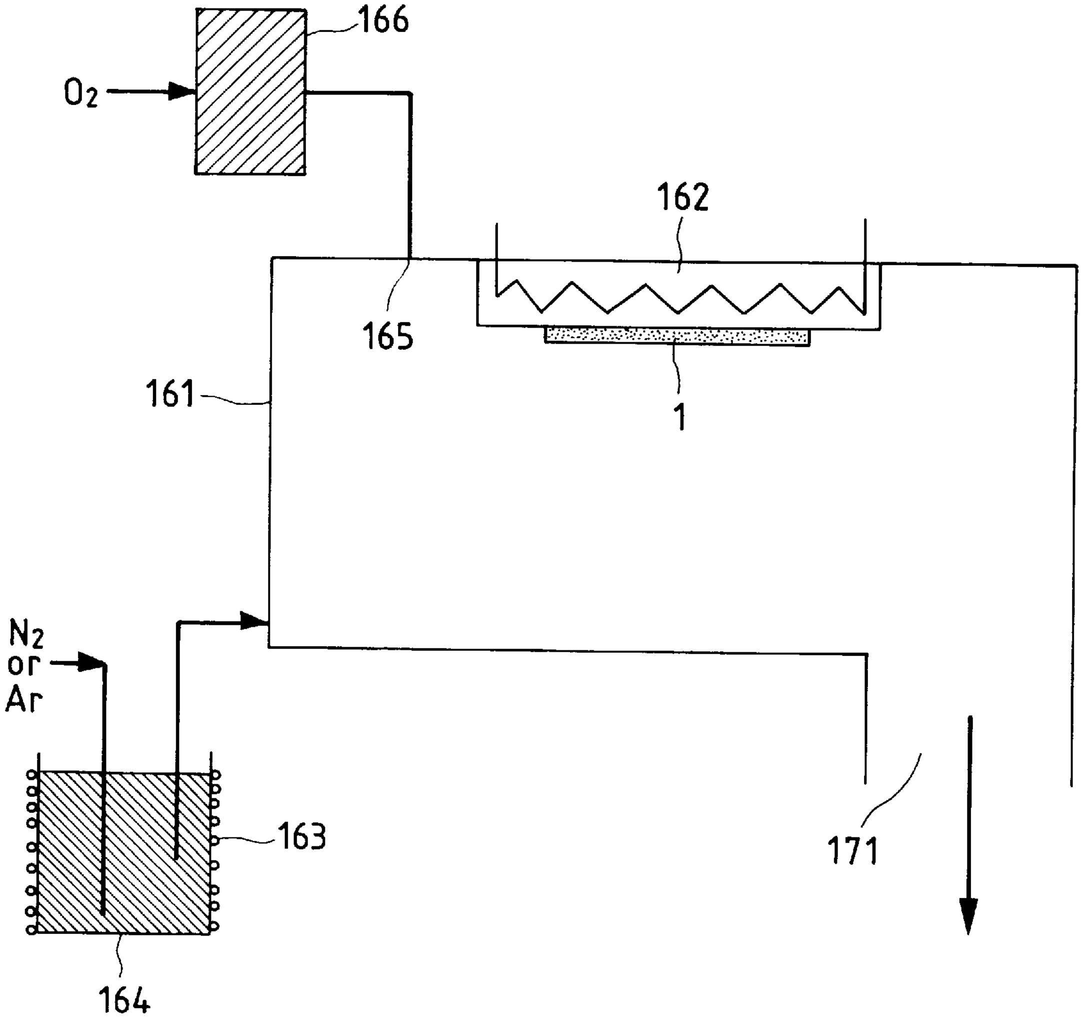
FIG. 17 is a schematic view of the atmospheric pressure CVD system as employed to prepare an electron source in Example 5.

Step f: The mask of FIG. 15 was used to form a Cr film 193 to a film thickness of 1,000 Å by vacuum deposition, which was then subjected to a patterning operation. Thereafter, fine particles were formed to produce thin films, each for forming an electron-emitting region, in a low pressure CVD system as shown in FIG. 17.

The CVD system used in this step had a configuration as described below. It comprises a chamber 161 containing in its upper area a substrate holder 162 for securing holding a substrate 1 by appropriate means (not shown) such as clamps with the film forming surface facing downward. The substrate holder 162 is provided with a heater and a thermocouple (not shown) to control the heater in such a way that the temperature of the substrate is constantly held to 300° C. A solution tank 164 provided with a surrounding heater 163 and a thermocouple (not shown) is arranged outside the chamber 161. The tank contained an organic palladium compound (ccp4230: available from Okuno Pharmaceutical Co., Ltd.) for this step. Otherwise, several gas inlet ports 165 are arranged around the substrate holder 162 so that $O_3$ gas may be introduced into the chamber therethrough (although only a single port is shown in FIG. 16). $O_3$ can be produced from $O_2$ by means of an ozonizer 166. The chamber 161 is also provided at the bottom with an exhaust port 171 so that the inner pressure of the chamber can be reduced by means of a vacuum pump (not shown).

For forming films of fine particles, the substrate secured to the substrate holder 162 was heated to 300° C. while the temperature of the heater 163 was raised to 80° C. to 100° C. and nitrogen or argon gas was made to flow at a rate of several SLM to introduce a gasified organic palladium compound into the chamber 161. At the same time, $O_3$ was introduced into the chamber through the gas inlet ports 165. The pressure inside the chamber was maintained between 0.1 and 10 Torr during the film forming operation. The organic palladium that has been introduced into the chamber was decomposed on the substrate 1 to produce fine particles containing palladium oxide as a principal ingredient.

The formed thin films 2 of fine particles had a film thickness of 100 Å and an electric resistance per unit area of $5\times10^4$ Ω/□±5–6%. While the dispersion of the electric resistance per unit area of the thin films was similar to that of the thin films of Example 4 produced in an atmospheric pressure CVD system, it may be obvious that a low pressure CVD system can produce better thin films than an atmospheric pressure CVD system in terms of even distribution of film height.

A display apparatus was prepared, using the above electron source that had not been subjected to an electric forming operation, and then made to emit electrons. No uneven distribution of brightness nor existence of dark spots due to uneven distribution of fine palladium particles was observed on the display screen.

Example 6

Figure 10:
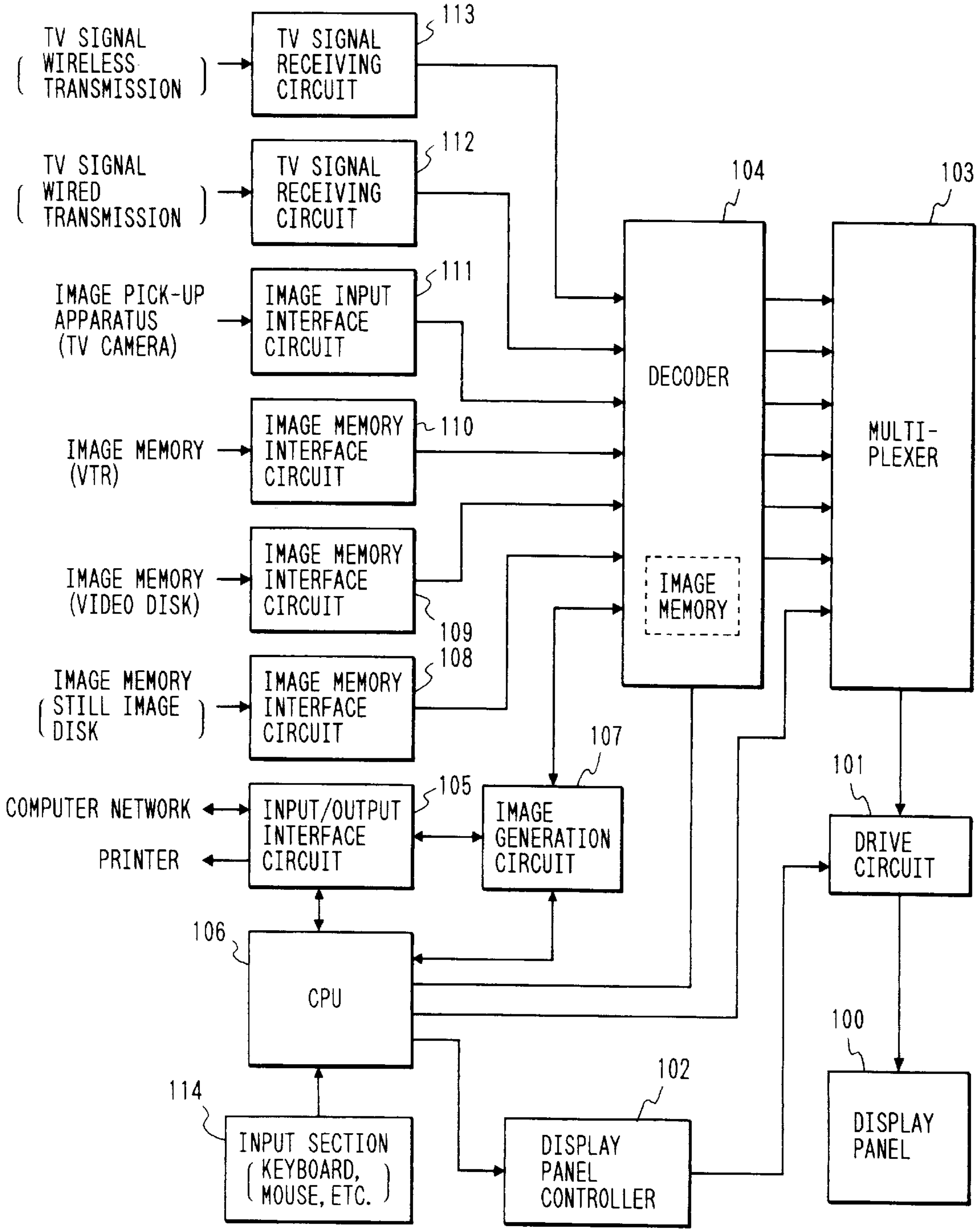
FIG. 10 is a block diagram of a display apparatus realized by using an image-forming apparatus manufactured by a method according to the invention.
Figure 11A:
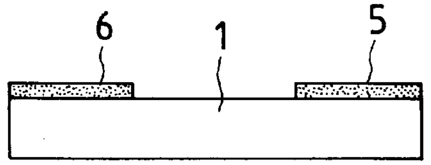
FIGS. 11A, 11B, 11C, 11D, 11E, 11F, 11G, 11H, 11I, 11J and 11K are schematic side views of a conventional electron-emitting device, showing different manufacturing steps.
Figure 11B:
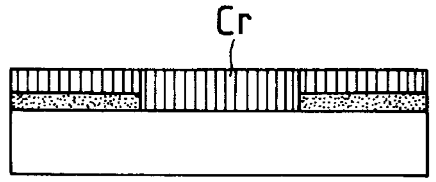
Figure 11C:
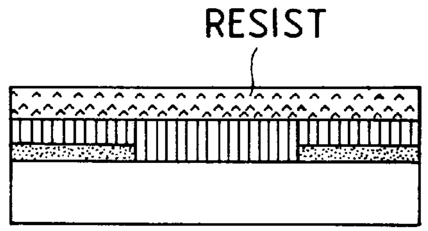
Figure 11D:
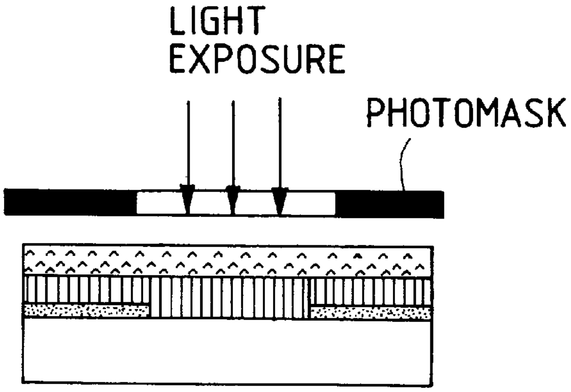
Figure 11E:
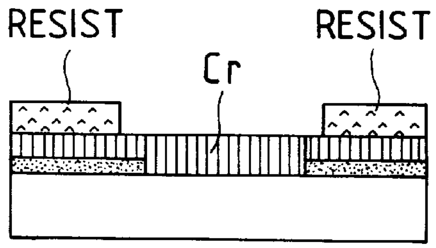
Figure 11F:
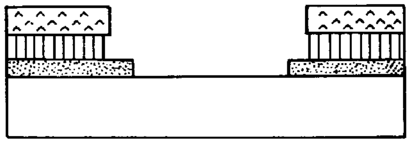
Figure 11G:
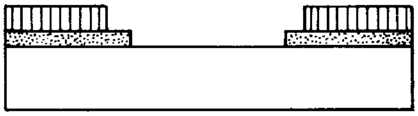
Figure 11H:
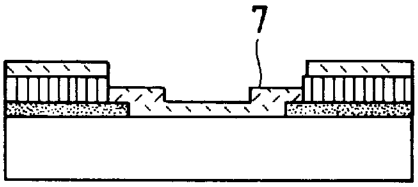
Figure 11I:
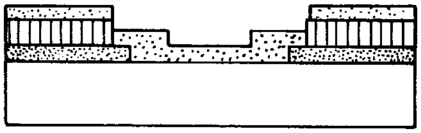
Figure 11J:
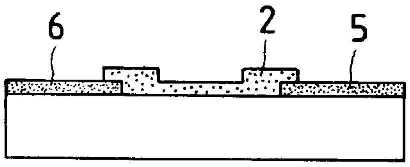
Figure 11K:
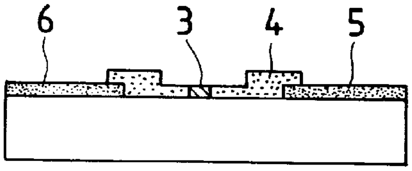

FIG. 10 is a block diagram of the display apparatus (display panel) prepared in Example 4 and designed to display a variety of visual data as well as pictures of television transmission in accordance with input signals coming from different signal sources.

Referring to FIG. 10, the apparatus comprises a display panel 100, a display panel drive circuit 101, a display controller 102, a multiplexer 103, a decoder 104, an input/output interface circuit 101, a CPU 106, an image generation circuit 107, image memory interface circuits 108, 109 and 110, an image input interface circuit 111, TV signal receiving circuits 112 and 113 and an input section 114. (If the display apparatus is used for receiving television signals that are constituted by video and audio signals, circuits, speakers and other devices are required for receiving, separating, reproducing, processing and storing audio signals along with the circuits shown in the drawing. However, such circuits and devices are omitted here in view of the scope of the present invention). Now, the components of the apparatus will be described, following the flow of image data therethrough.

Firstly, the TV signal reception circuit 113 is a circuit for receiving TV image signals transmitted via a wireless transmission system using electromagnetic waves and/or spatial optical telecommunication networks. The TV signal system to be used is not limited to a particular one and any system such as National Television System Committee (NTSC), Phase Alternation Line or Sequential couleur a'memorie (sequential with memory) may feasibly be used with it. It is particularly suited for TV signals involving a larger number of scanning lines (typically of a high definition TV system such as the MUSE system) because it can be used for a large display panel comprising a large number of pixels. The TV signals received by the TV signal reception circuit 113 are forwarded to the decoder 104.

Secondly, the TV signal reception circuit 112 is a circuit for receiving TV image signals transmitted via a wired transmission system using coaxial cables and/or optical fibers. Like the TV signal reception circuit 113, the TV signal system to be used is not limited to a particular one and the TV signals received by the circuit are forwarded to the decoder 104.

The image input interface circuit 111 is a circuit for receiving image signals forwarded from an image input device such as a TV camera or an image pick-up scanner. It also forwards the received image signals to the decoder 104.

The image memory interface circuit 110 is a circuit for retrieving image signals stored in a video tape recorder (hereinafter referred to as VTR) and the retrieved image signals are also forwarded to the decoder 104.

The image memory interface circuit 109 is a circuit for retrieving image signals stored in a video disc and the retrieved image signals are also forwarded to the decoder 104.

The image memory interface circuit 108 is a circuit for retrieving image signals stored in a device for storing still image data such as so-called still disc and the retrieved image signals are also forwarded to the decoder 104.

The input/output interface circuit 105 is a circuit for connecting the display apparatus and an external output signal source such as a computer, a computer network or a printer. It carriers out input/output operations for image data and data on characters and graphics and, if appropriate, for control signals and numerical data between the CPU 106 of the display apparatus and an external output signal source.

The image generation circuit 107 is a circuit for generating image data to be displayed on the display screen on the basis of the image data and the data on characters and graphics input from an external output signal source via the input/output interface circuit 105 or those coming from the CPU 106. The circuit comprises reloadable memories for storing image data and data on characters and graphics, read-only memories for storing image patterns corresponding given character codes, a processor for processing image data and other circuit components necessary for the generation of screen images.

Image data generated by the circuit for display are sent to the decoder 104 and, if appropriate, they may also be sent to an external circuit such as a computer network or a printer via the input/output interface circuit 105.

The CPU 106 controls the display apparatus and carriers out the operation of generating, selecting and editing images to be displayed on the display screen.

For example, the CPU 106 sends control signals to the multiplexer 103 and appropriately selects or combines signals for images to be displayed on the display screen. At the same time it generates control signals for the display panel controller 102 and controls the operation of the display apparatus in terms of image display frequency, scanning method (e.g., interlaced scanning or non-interlaced scanning), the number of scanning lines per frame and so on.

The CPU 106 also sends out image data and data on characters and graphic directly to the image generation circuit 107 and accesses external computers and memories via the input/output interface circuit 105 to obtain external image data and data on characters and graphics.

The CPU 106 may additionally be so designed as to participate other operations of the display apparatus including the operation of generating and processing data like the CPU of a personal computer or a word processor.

The CPU 106 may also be connected to an external computer network via the input/output interface circuit 105 to carry out numerical computations and other operations, cooperating therewith.

The input section 114 is used for forwarding the instructions, programs and data given to it by the operator to the CPU 106. As a matter of fact, it may be selected from a variety of input devices such as keyboards, mice, joy sticks, bar code readers and voice recognition devices as well as any combinations thereof.

The decoder 104 is a circuit for converting various image signals input via said circuits 107 through 113 back into signals for three primary colors, luminance signals and I and Q signals. Preferably, the decoder 104 comprises image memories as indicated by a dotted line in FIG. 25 for dealing with television signals such as those of the MUSE system that require image memories for signal conversion. The provision of image memories additionally facilitates the display of still images as well as such operations as thinning out, interpolating, enlarging, reducing, synthesizing and editing frames to be optionally carried out by the decoder 104 in cooperation with the image generation circuit 107 and the CPU 106.

The multiplexer 103 is used to appropriately select images to be displayed on the display screen according to control signals given by the CPU 106. In other words, the multiplexer 103 selects certain converted image signals coming from the decoder 104 and sends them to the drive circuit 101. It can also divide the display screen in a plurality of frames to display different images simultaneously by switching from a set of image signals to a different set of image signals within the time period for displaying a single frame as in the case of a split screen of television broadcasting.

The display panel controller 102 is a circuit for controlling the operation of the drive circuit 101 according to control signals transmitted from CPU 106.

Among others, the display panel 102 operates to transmit signals to the drive circuit 101 for controlling the sequence of operations of the power source (not shown) for driving the display panel in order to define the basic operation of the display panel.

It also transmits signals to the drive circuit 101 for controlling the image display frequency and the scanning method (e.g., interlaced scanning or noninterlaced scanning) in order to define the mode of driving the display panel.

If appropriate, it also transmits signals to the drive circuit 101 for controlling the quality of the images to be displayed on the display screen in terms of luminance, contrast, color tone and sharpness.

The drive circuit 101 is a circuit for generating drive signals to be applied to the display panel 101. It operates according to image signals coming from said multiplexer 103 and control signals coming from the display panel controller 102.

A display apparatus according to the invention and having a configuration as described above and illustrated in FIG. 10 can display on the display panel 100 various images given from a variety of image data sources. More specifically, image signals such as television image signals are converted back by the decoder 104 and then selected by the multiplexer 103 before sent to the drive circuit 101. On the other hand, the display controller 102 generates control signals for controlling the operation of the drive circuit 101 according to the image signals for the images to be displayed on the display panel 100. The drive circuit 101 then applies drive signals to the display panel 100 according to the image signals and the control signals. Thus, images are displayed on the display panel 100. All the above described operations are controlled by the CPU 106 in a coordinated manner.

The above described display apparatus can not only select and display particular images out of a number of images given to it but also carry out various image processing operations including those for enlarging, reducing, rotating, emphasizing edges of, thinning out, interpolating, changing colors of and modifying the aspect ratio of images and editing operations including those for synthesizing, erasing, connecting, replacing and inserting images as the image memories incorporated in the decoder 104, the image generation circuit 107 and the CPU 106 participate such operations. Although not described with respect to the above embodiment, it is possible to provide it with additional circuits exclusively dedicated to audio signal processing and editing operations.

Thus, a display apparatus according to the invention and having a configuration as described above can have a wide variety of industrial and commercial applications because it can operate as a display apparatus for television broadcasting, as a terminal apparatus for video teleconferencing, as an editing apparatus for still and movie pictures, as a terminal apparatus for a computer system, as an OA apparatus such as a word processor, as a game machine and in many other ways.

It may be needless to say that FIG. 10 shows only an example of possible configuration of a display apparatus comprising a display panel provided with an electron source prepared by arranging a number of surface conduction electron-emitting devices and the present invention is not limited thereto. For example, some of the circuit components of FIG. 10 may be omitted or additional components may be arranged there depending on the application. For instance, if a display apparatus according to the invention is used for visual telephone, it may be appropriately made to comprise additional components such as a television camera, a microphone, lighting equipment and transmission/reception circuits including a modem.

Since a display apparatus according to the invention comprises a display panel that is provided with an electron source prepared by arranging a large number of surface conduction electron-emitting device and hence adaptable to reduction in the depth, the overall apparatus can be made very thin. Additionally, since a display panel comprising an electron source prepared by arranging a large number of surface conduction electron-emitting device is adapted to have a large display screen with an enhanced luminance and provide a wide angle for viewing, it can offer really impressive scenes to the viewers with a sense of presence.

Example 7

A specimen of electron-emitting device of the type as shown in FIGS. 1A and 1B was prepared. Namely, the specimen had a plan view and a sectional side view as shown in FIGS. 1A and 1B respectively. Note that, in FIGS. 1A and 1B, L1 denotes the distance separating the device electrodes 5 and 6 and W1 and d respectively denote the width and the thickness of the device electrodes while L2 and W2 respectively denote the length and the width of the thin film 4 including the electron-emitting region.

The specimen was formed, following the steps described below by referring to FIGS. 4A through 4E. Note that Steps a through e described below corresponding to FIGS. 4A through 4E respectively.

Step a: A quartz substrate was used for the insulating substrate 1. After thoroughly cleansing the substrate 1 with detergent, pure water and an organic solvent, a photoresist material (RD-2000N: available from Hitachi Chemical Co., Ltd.) was applied thereto by means of a spinner which was rotated at a rate of 2500 rpm for 40 seconds. The substrate carrying the photoresist was then prebaked at 80° C. for 25 minutes.

A mask having a plan view identical with that of the intended device electrodes that are separated by a distance L1 equal to 2 $\mu$m, each having a width W1 equal to 500 $\mu$m, was tightly placed on the substrate, which was then exposed to light and thereafter subjected to a photographic development operation using a developing solution for RD-2000N. Subsequently, the substrate was postbaked at 120° C. for 20 minutes.

Nickel (Ni) was used for the device electrodes 5, 6 which were formed by means of a resistance-heating/deposition system to a height of 100 nm with a rate of deposition of 0.3 nm/sec.

The photoresist was removed, using acetone and a lift-off technique. The substrate was then cleansed sequentially with acetone, isopropanol and butylacetate and dried.

Thereafter, an original pattern was formed by using a material containing an organic palladium complex in a manner as described below.

| (Organic Palladium Compound) | |
|---|---|
| a mixture of a 0.1 mol (22.49 g) of palladium acetate and a 0.2 mol (22.24 g) of n-dipropylamine | 3 weight portions |
| polybutylmethacrylate (Dianal BR-79: available from Mitsubishi Rayon Co., Ltd.) | 7 weight portions |
| methylethylketone | 60 weight portions |

A solution of a mixture of the above listed materials was applied on a polyethyleneterephthalate (PET) film having a thickness of 25 $\mu$m to show a designed pattern and caused to dry to become an original pattern. After drying, the applied mixture showed a height of 2 $\mu$m.

Steps b and c: The original pattern 8 was brought into closely contact with the substrate bearing a pair of device electrodes in such a way that the pattern was located between the electrodes to bridge them and then it was thermally scanned by a thermal head 10 of a transfer system having a configuration as illustrated in FIG. 18 from the back of the PET film so that only the pattern was heated.

Figure 18:
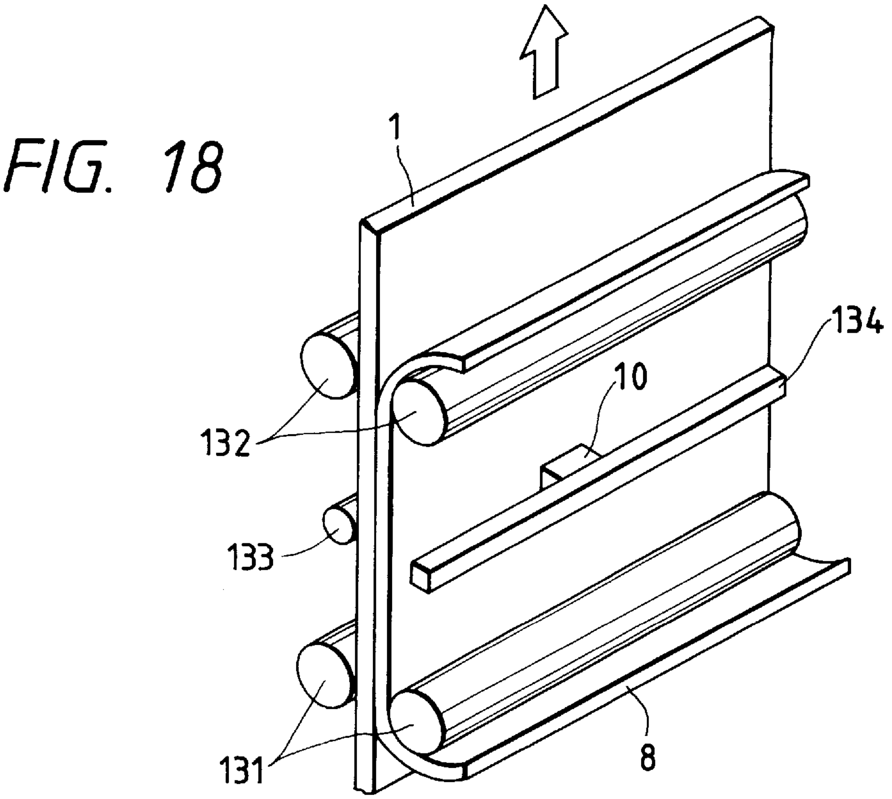
FIG. 18 is a schematic perspective view of a sublimation transfer system that can be used for the purpose of the invention.

Referring to FIG. 18, the quartz substrate 1 bearing a pair of device electrodes and the original pattern 8 are held together in close contact with each other and moved upward by means of two pairs of rollers 131 and 132. The original pattern 8 is fed to the first pair of rollers 131 by feed rollers (not shown) and brought into close contact with the quartz substrate 1 before it is heated by a thermal head 10 movably fitted to a scan guide rail 134 which is arranged opposite to a roller 133 along the path of the quartz substrate 1 and the original pattern 8. Thereafter, the original pattern 8 is peeled off from the quartz substrate 1 at the pair of separator rollers 132 and wound on a take-up roller (not shown).

The temperature of the thermal head was held to 120° C.

After the original pattern 8 was separated from the quartz substrate 1, it was found that a thin film 7 of the organic palladium complex had been transferred to a position between the device electrodes on the quartz substrate 1. The thin film 7 showed exactly the profile of the pattern of the original 8 which had a width W2 of 300 $\mu$m and located substantially at the middle of the device electrodes 5, 6.

Step d: The sublimation-transferred thin film 7 of an organic palladium complex was baked at 300° C. for 10 minutes to produce a thin film 2 for forming an electron-emitting region of fine particles (average particle size: 7 nm) containing palladium oxide (PdO) as a principal ingredient.

The thin film 2 for forming an electron-emitting region had a height of 10 nm and an electric resistance per unit area equal to $5\times10^4$ Ω/□.

Step e: An electron-emitting region 3 was formed in the thin film 2 by applying a voltage between the device electrodes 5, 6 for an electric energizing (forming) operation. FIG. 3B shows a graph of the voltage waveforms used for the electric forming operation of this example.

In FIG. 3B, T1 and T2 respectively denote the pulse width and the pulse interval of the applied pulse voltage, which were respectively 1 millisecond and 10 milliseconds for this example. The wave height (the peak voltage for the forming operation) of the applied triangular pulse voltage was 5 V and the operation was conducted in vacuum of $10^{-6}$ Torr. It was found that the produced electron-emitting region 3 had fissures therein, each having a width of about 150 nm.

The prepared specimen of electron-emitting device was tested for its electron-emitting performance, using a gauging system as illustrated in FIG. 5.

The anode 44 and the electron-emitting device was separated by a distance H equal to 4 mm and the voltage of the node was 1 kV, the inside of the vacuum chamber of the system being evacuated to a degree of vacuum of $1\times10^{-6}$ Torr for the performance test. FIG. 6 shows a graph of the current-voltage relationships similar to those of the specimen obtained by the test.

In the case of the specimen, the emission current Ie should an abrupt rise as the device voltage approached near 8 V. The device current If and the emission current Ie were respectively 2.2 mA and 1.1 $\mu$A when the device voltage reached 14 V to prove an electron emission efficiency $\eta$=Ie/If(%) of 0.05%.

Example 8

A specimen of electron-emitting device of the type as shown in FIGS. 1A and 1B was prepared.

The specimen was formed, following the steps described below by referring to FIGS. 19A through 19E. Note that Steps a through e described below correspond to FIGS. 19A through 19E respectively.

Step a: A substrate having a pair of device electrodes was prepared as in Step 1 of Example 7.

Thereafter, an original pattern was formed by using a material containing an organic palladium complex in a manner as described below.

| (Organic Palladium Compound) | |
|---|---|
| a mixture of a 0.1 mol (22.49 g) of palladium acetate and a 0.2 mol (22.24 g) of n-dipropylamine | 3 weight portions |
| laser absorbing pigment (IR-820: available from Nippon Kayaku Co., Ltd.) | 0.6 weight portions |
| polybutylmethacrylate (Dianal BR-79: available from Mitsubishi Rayon Co., Ltd.) | 7 weight portions |
| methylethylketone | 60 weight portions |

A solution of a mixture of the above listed materials was applied on a polyethyleneterephthalate (PET) film having a thickness of 25 $\mu$m to show a designed pattern and caused to dry to become an original pattern. After drying, the applied mixture showed a height of 2 $\mu$m.

Steps b and c: The original pattern 8 was brought into closely contact with the substrate bearing a pair of device electrodes in such a way that the pattern was located between the electrodes to bridge them and then it was thermally scanned by a semiconductor laser device (for emitting a laser beam having a wavelength of 830 nm and a power of 8 mW) emitted from a transfer system having a configuration as illustrated in FIG. 20 from the back of the PET film so that only the pattern was heated.

Figure 20:
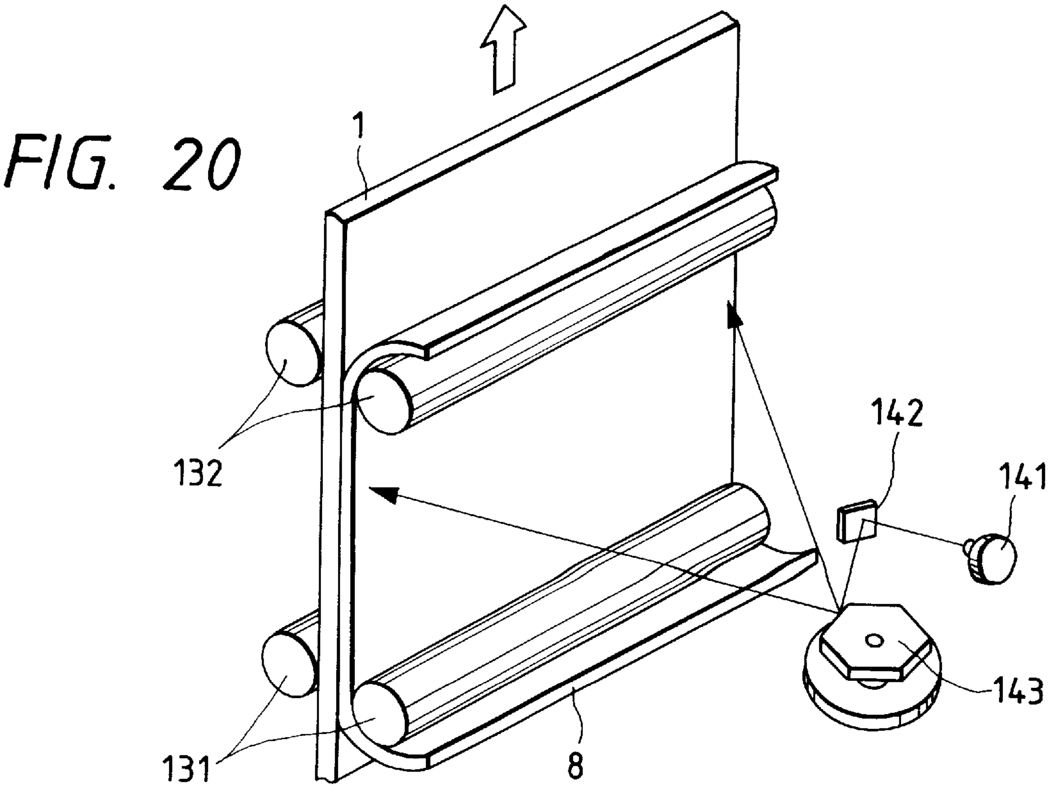
FIG. 20 is a schematic perspective view of another sublimation transfer system that can be used for the purpose of the invention.
Figure 19A:
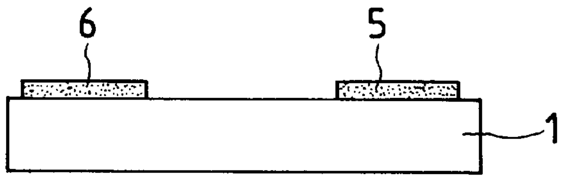
Figs. 19A, 19B, 19C, 19D and 19E are schematic side views of an electron-emitting device manufactured by a method according to the invention in Example 8, showing different manufacturing steps.
Figure 19B:
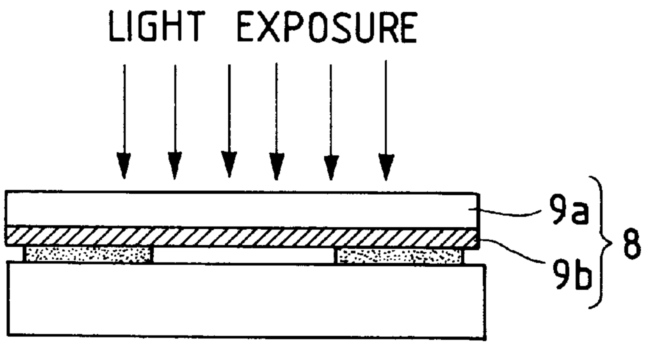
Figure 19C:
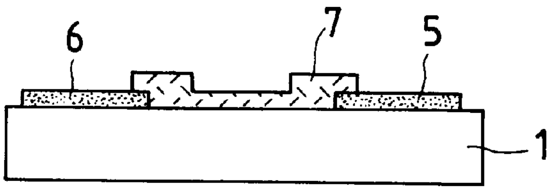
Figure 19D:
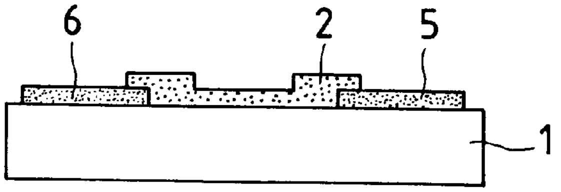
Figure 19E:
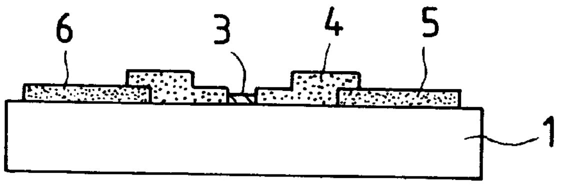
Figure 21A:
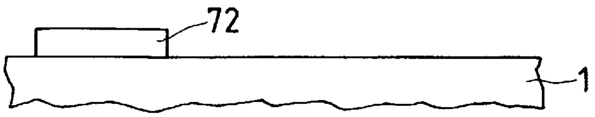
FIGS. 21A, 21B, 21C, 21D, 21E, 21F, 21G and 21H are schematic side views of an electron source realized by using electron-emitting devices manufactured by a method according to the invention, showing different manufacturing steps.
Figure 21B:
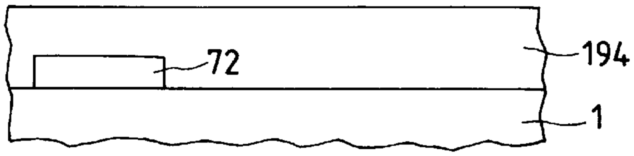
Figure 21C:
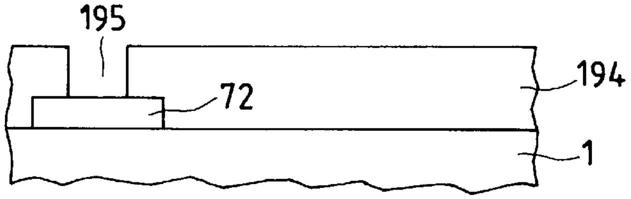
Figure 21D:
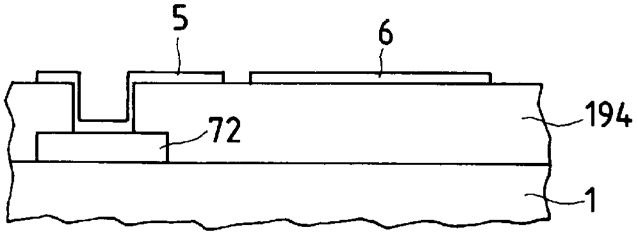
Figure 21E:
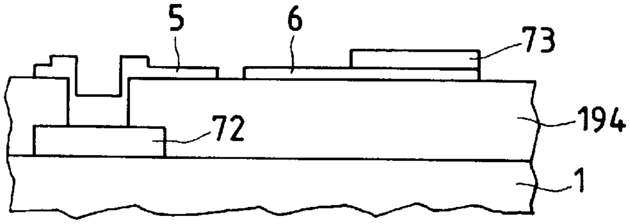
Figure 21F:
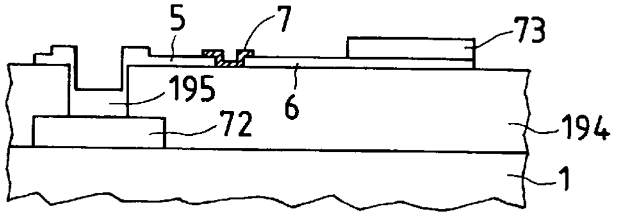
Figure 21G:
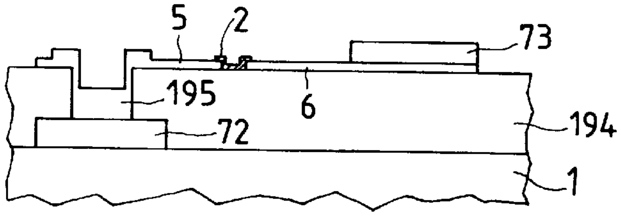
Figure 21H:
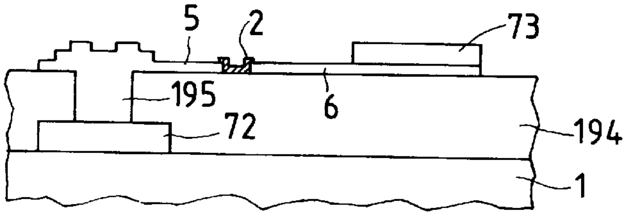

Referring to FIG. 20, the quartz substrate 1 bearing a pair of device electrodes and the original pattern 8 are held together in close contact with each other and moved upward by means of two pairs of rollers 131 and 132. The original pattern 8 is fed to the first pair of rollers 131 by feed rollers (not shown) and brought into close contact with the quartz substrate 1 before it is exposed to laser beam emitted from a semiconductor laser device 141 by way of a reflector 142 and a polygon mirror 143. Thereafter, the original pattern 8 is peeled off from the quartz substrate 1 at the pair of separator rollers 132 and wound on a take-up roller (not shown).

After the original pattern 8 was separated from the quartz substrate 1, it was found that a thin film 7 of the organic palladium complex had been transferred to a position between the device electrodes on the quartz substrate 1. The thin film 7 showed exactly the profile of the pattern of the original 8 which had a width W2 of 300 $\mu$m and located substantially at the middle of the device electrodes 5, 6.

Step d: The sublimation-transferred thin film 7 of an organic palladium complex was baked at 300° C. for 10 minutes to produce a thin film 2 for forming an electron-emitting region of fine particles (average particle size: 7 nm) containing palladium oxide (PdO) as a principal ingredient.

Step e: An electron-emitting region 3 was formed by applying a voltage between the device electrodes 5, 6 for an electric energizing (forming) operation as in the case of Example 7.

The prepared specimen of electron-emitting device was tested for its electron-emitting performance as in the case of Example 7. The emission current Ie showed an abrupt rise as the device voltage approached near 8. The device current If and the emission current Ie were respectively 2.2 mA and 1.1 $\mu$A when the device voltage reached 14 V to prove an electron emission efficiency $\eta$=Ie/If(%) of 0.05%.

Example 9

A specimen of electron-emitting device was prepared as in the case of Example 7 except that the operation of sublimation transfer was carried out under a reduced pressure of $1\times10^{-2}$ Torr with a thermal head heated to 50° C.

The prepared specimen of electron-emitting device was tested for its electron-emitting performance as in the case of Example 7. The emission current Ie showed an abrupt rise as the device voltage approached near 8. The device current If and the emission current Ie were respectively 2.2 mA and 1.1 $\mu$A when the device voltage reached 14 V to prove an electron emission efficiency $\eta$=Ie/If(%) of 0.05%.

Example 10

In this example, an image-forming apparatus as shown in FIG. 8 was prepared, using an electron source realized by arranging a number of electron-emitting devices into a matrix as shown in FIG. 7.

FIG. 12 shows a schematic partial plan view of the electron source and FIG. 13 shows a schematic partial sectional view taken along line 13—13 of FIG. 12. Note that same or similar components are respectively designated by same reference symbols in FIGS. 7, 12 and 13. In these drawings, 71 denotes a substrate and 72 and 73 respectively denote a plurality of X-directional wirings and a plurality of Y-directional wirings (which may be called lower and upper wirings respectively). Otherwise, the electron source comprises electron-emitting devices, each having a thin film 2 including an electron-emitting region and a pair of device electrodes 5 and 6, an interlayer insulation layer 194 and a number of contact holes 195, each of which is used to connect the device electrode 5 of a device with a related lower wiring 72.

Now, the steps of manufacturing an electron source and an image-forming apparatus incorporating such as electron source used in this example will be described in detail by referring to FIGS. 21A through 21H. Note that Steps a through h below correspond to FIGS. 21A through 21H respectively.

Step a: After thoroughly cleansing a quartz substrate 1, Cr and Au were sequentially laid by vacuum deposition to thicknesses of 50 Å and 6,000 Å a respectively and then a photoresist (AZ1370: available from Hoechst Corporation) was formed thereon by means of a spinner, while rotating the film, and baked.

Thereafter, a photo-mask image was exposed to light and developed to produce a resist pattern for the lower wirings 72 and then the deposited Au/Cr film was wet-etched to produce lower wiring 72 having a desired profile.

Step b: A silicon oxide film was formed as an interlayer insulation layer 194 to a thickness of 1.0 μm by RF sputtering.

Step c: A photoresist pattern was prepared for producing contact holes 195 in the silicon oxide film deposited in Step b, which contact holes 195 were then actually formed by etching the interlayer insulation layer 161, using the photoresist pattern for a mask. RIE (Reactive Ion Etching) using $CF_4$ gas and $H_2$ gas was employed for the etching operation.

Step d: Thereafter, a pattern of photoresist (RD-2000N-41: available from Hitachi Chemical Co., Ltd.) was formed for pairs of device electrodes 5 and 6 and gaps G separating the respective pairs of electrodes and then Ti and Ni were sequentially deposited thereon respectively to thicknesses of 50 Å and 1,000 Å by vacuum deposition. The photoresist pattern was dissolved by an organic solvent and the Ni/Ti deposit film was treated by using a lift-off technique to produce pairs of device electrodes 5 and 6, each pair having a width W1 of 300 μm and separated from each other by a distance L1 of 20 μm.

Step e: After forming a photoresist pattern on the device electrodes 5, 6 for upper wirings 73, Ti and Au were sequentially deposited by vacuum deposition to respective thicknesses of 50 Å and 5,000 Å and then unnecessary areas were removed by means of a lift-off technique to produce upper wirings 73 having a desired profile Step f: A number of organic palladium thin films 7 were formed on the substrate such that the films bridged respective pairs of device electrodes by using an original pattern that had been prepared as the one in Example 8 and a pattern transfer system of Example 8 (FIG. 20) and scanning the pattern with a laser beam, turning on and off the laser output in synchronism with the scanning operation in order to sublimate and transfer the organic palladium compound of the pattern.

Step g: The formed organic palladium thin films 7 were heated and baked to change the organic palladium compound into PdO and produce thin films 2, each for forming electron-emitting region.

Step h: Then, a pattern for applying photoresist to the entire surface area except the contact holes 195 was prepared and Ti and Au were sequentially deposited by vacuum deposition to respective thicknesses of 50 Å and 5,000 Å. Any unnecessary areas were removed by means of a lift-off technique to consequently bury the contact holes 195.

Now, lower wirings 72, an interlayer insulation layer 194, upper wirings 73, pairs of device electrodes 5 and 6 and thin films 2 were produced on the insulating substrate 1.

Then, an image-forming apparatus incorporating the electron source that had not been subjected to an electric forming process was prepared. This will be described below by referring to FIGS. 8, 9A and 9B.

The electron source 81 that had not been subjected to an electric forming process was rigidly fitted to a rear plate 82 and thereafter a face plate 90 (prepared by forming a fluorescent film 88 and a metal back 89 as image-forming members on the inner surface of a glass substrate 103) was arranged 5 mm above the electron source 81 by interposing a support frame 83 therebetween. Frit glass was applied to junction areas of the face plate 90, the support frame 83 and the rear plate 82, which were then baked at temperature between 400° C. and 500° C. for 10 minutes in the atmosphere and bonded together to a hermetically sealed condition (FIG. 8). The electron source 81 was also firmly bonded to the rear plate 82 by means of frit glass.

While the fluorescent film 88 which is an image-forming member may be solely made of phosphor if the image-forming apparatus is for displaying black and white images, firstly black stripes were arranged and then the gaps separating the black stripes were filled with respective phosphorous substances for primary colors to produce a fluorescent film 88 for this example (FIGS. 9A and 9B). The black stripes were made of a popular material containing graphite as a principal ingredient. The phosphorous substances were applied to the glass substrate 103 by using a slurry method.

A metal back is normally arranged on the inner surface of the fluorescent film 88. In this example, a metal back was prepared by producing an A1 film by vacuum deposition on the inner surface of the fluorescent film 88 that had been smoothed (in a so-called filming process). The face plate 90 may be additionally provided with transparent electrodes arranged close to the outer surface of the fluorescent film 88 in order to improve the electric conductivity of the fluorescent film 88, no such electrodes were used in this example because the metal back proved to be sufficiently conductive. The stripes of the phosphorous substances were carefully aligned with the respective electron-emitting devices before the above described bonding operation.

The prepared glass container was then evacuated by means of an exhaust pipe (not shown) and an exhaust pump to achieve a sufficient degree of vacuum inside the container. Thereafter, the thin film of each of the electron-emitting devices arranged on the substrate was subjected to an electric forming operation, where a voltage was applied to the device electrodes of the electron-emitting devices by way of the respective external terminals Dox1 through Doxm and Doy1 through Doyn to produce an electron-emitting region in each thin film as in the case of Example 1.

Thereafter, the enclosure was completely sealed by heating, melting and closing the exhaust pipe (not shown) in vacuum of a degree of approximately $1\times10^{-6}$ Torr.

Finally, a getter operation was carried out on the apparatus in order to maintain a high degree of vacuum within the enclosure.

The electron-emitting devices of the prepared image-forming apparatus were then caused to emit electrons by applying a drive voltage thereto through the external terminals Dox1 through Doxm and Doy1 through Doyn and the emitted electrons were accelerated by applying a high voltage of several kV to the metal back 89 via the high voltage terminal Hv so that they collides with the fluorescent film 88 until the latter was energized to emit light and produce images.

Example 11

This example deals with an image-forming apparatus comprising a large number of surface conduction electron-emitting devices and control electrodes (grids).

The apparatus of this example was prepared by using a number of electron-emitting devices that had been formed in a manner as described in Example 8.

The configuration of the apparatus will be described in terms of the electron source of the apparatus prepared by arranging a number of surface conduction electron-emitting devices.

Figure 22:
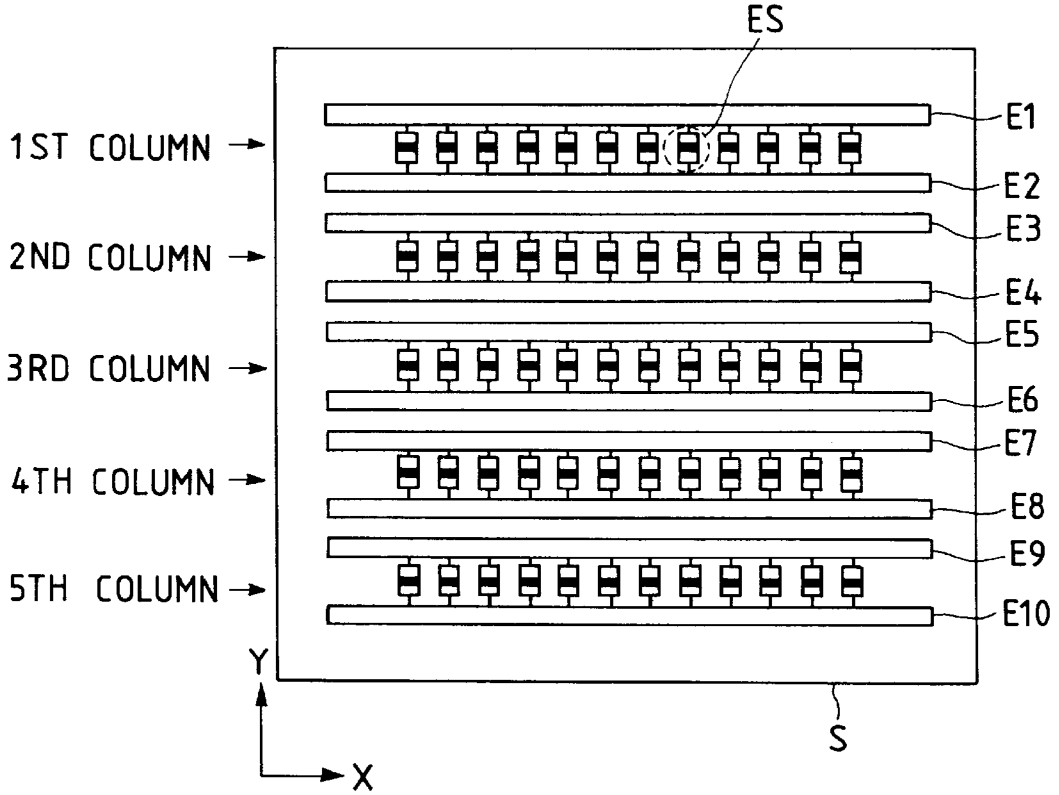
FIG. 22 is a schematic illustration of an arrangement of an electron source as employed in Example 11.
Figure 23:
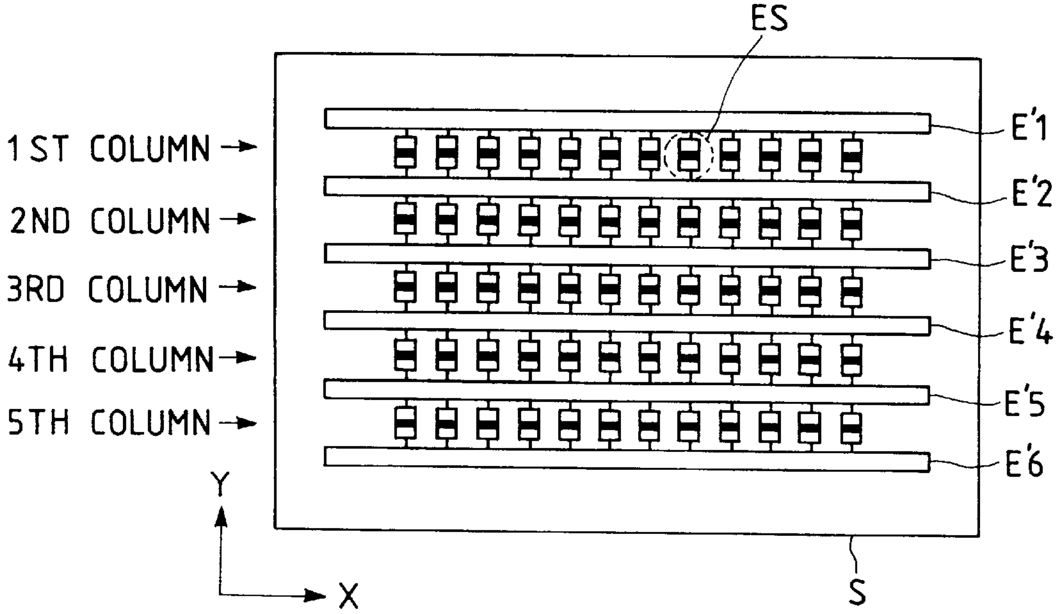
FIG. 23 is a schematic illustration of an alternative arrangement of an electron source as employed in Example 11.

FIGS. 22 and 23 are schematic plan views of two different substrates and electron source alternatively used in the image-forming apparatus.

Firstly referring to FIG. 22, S denotes an insulating substrate typically made of glass and ES denotes an surface conduction electron-emitting device arranged on the substrate S and shown in a dotted circle, whereas E1 through E10 denote wiring electrodes for wiring the surface conduction electron-emitting devices, which are arranged in columns on the substrate along the X-direction (hereinafter referred to as device columns). The surface conduction electron-emitting devices of each device column are electrically connected in parallel with each other by a pair of wiring electrodes. (For instance, the devices of the first device column are connected in parallel with each other by the wiring electrodes E1 and E2.)

In the apparatus of this example comprising the above described electron source, the electron source can drive any device column independently by applying an appropriate drive voltage to the related wiring electrodes. More specifically, a voltage exceeding the electron emission threshold level is applied to the device columns to be driven to emit electrons, whereas a voltage below the electron emission threshold level (e.g. 0[V]) is applied to the remaining device columns. (A drive voltage exceeding the electron emission threshold level is referred to as VE[V] hereinafter.)

In FIG. 23 illustrating another electron source that was alternatively used for this example, S denotes an insulating substrate typically made of glass and ES denotes an surface conduction electron-emitting device arranged on the substrate S and shown in a dotted circle, whereas E'1 through E'6 denote wiring electrodes for wiring the surface conduction electron-emitting devices, which are arranged in columns on the substrate along the X-direction as in the case of FIG. 22. The surface conduction electron-emitting devices of each device column are electrically connected in parallel with each other by a pair of wiring electrodes. Additionally, in this alternative electron source, a single wiring electrode is arranged between any two adjacent device columns to serve for the both columns. For instance, a common wiring electrode E'2 serves for both the first device column and the second device column. This arrangement of wiring electrodes is advantageous in that, if compared with the arrangement of FIG. 22, the space separating any two adjacent columns of surface conduction electron-emitting devices can be significantly reduced along the Y-direction.

In the apparatus of this example comprising the above described electron source, the electron source can drive any device column independently by applying an appropriate drive voltage to the related wiring electrodes. More specifically, VE[V] is applied to the device columns to be driven to emit electrons, whereas 0[V] is applied to the remaining device columns. For instance, only the devices of the third column can be driven to operate by applying 0[V] to the wiring electrodes E'1 through E'3 and VE[V] to the wiring electrodes E'4 through E'6. Consequently, VE−0=VE [V] is applied to the devices of the third column, whereas 0[V], 0−0=0[V] or VE−VE=0[V], is applied to all the devices of the remaining columns. Likewise, the devices of the second and the fifth columns can be driven to operate simultaneously by applying 0[V] to the wiring electrodes E'1, E'2 and E'6 and VE[V] to the wiring electrodes E'3, E'4 and E'5. In this way, the devices of any device column of this electron source can be driven selectively.

While each device column has twelve (12) surface conduction electron-emitting devices arranged along the X-direction in the electron sources of FIGS. 22 and 23, the number of devices to be arranged in a device column is not limited thereto and a greater number of devices may alternatively be arranged. Additionally, while there are five (5) device columns in each of the electron sources, the number of device columns is not limited thereto and a greater number of device columns may alternatively be arranged.

Now, a panel type CRT incorporating an electron source of the above described type will be described.

Figure 24:
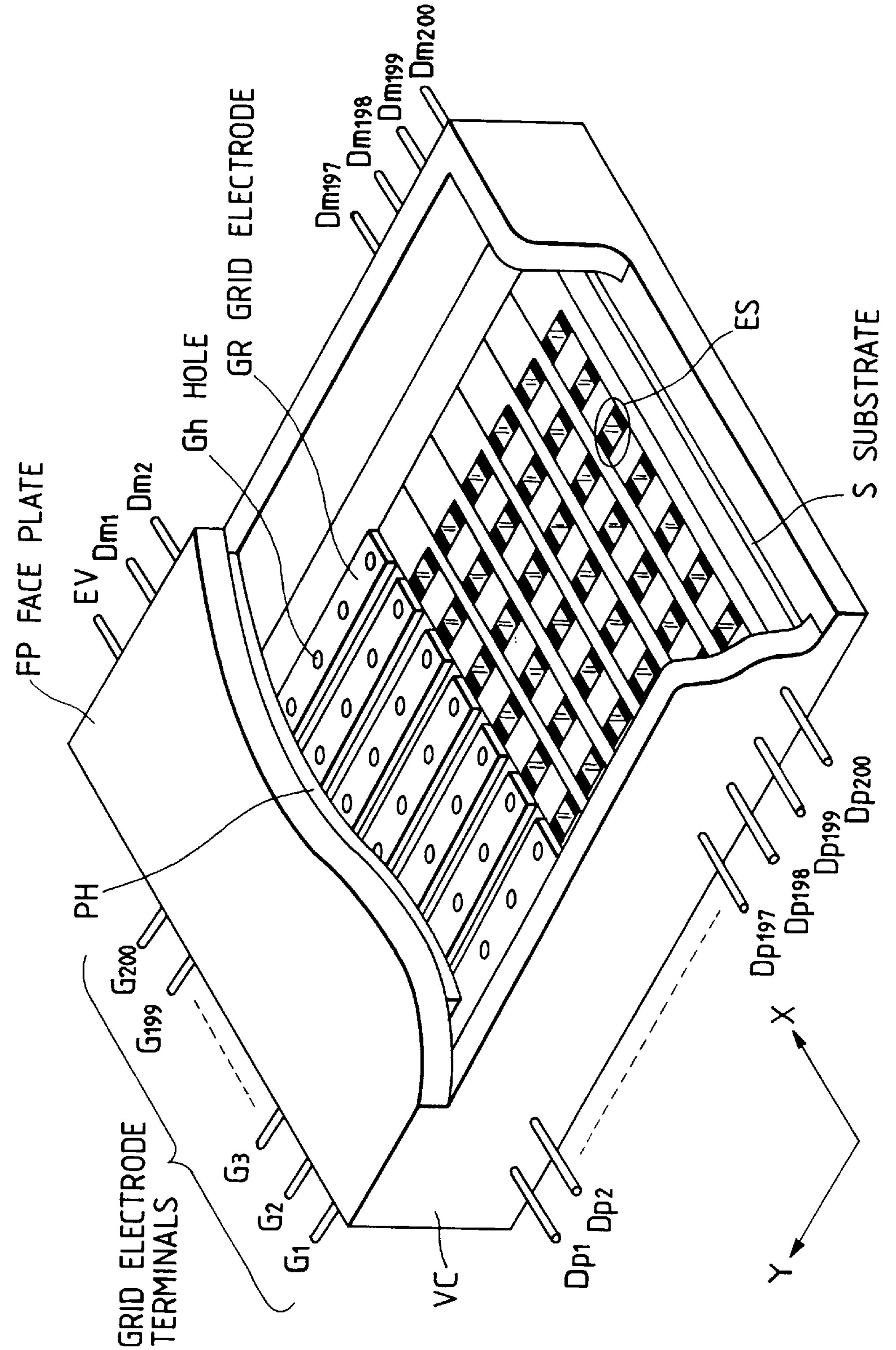
FIG. 24 is a partially cutaway schematic perspective view of an image-forming apparatus manufactured by a method according to the invention in Example 11, showing the configuration of its display panel.

FIG. 24 is a schematic perspective view of a panel type CRT incorporating an electron source as illustrated in FIG. 22. In FIG. 24, VC denote a glass vacuum container provided with a face plate FP for displaying images. A transparent electrode typically made of ITO is arranged on the inner surface of the face plate PH and red, green and blue fluorescent members are applied onto the transparent electrode in the form of a mosaic or stripes without interfering with each other. To simplify the illustration, the transparent electrodes and the fluorescent members are collectively indicated by PH in FIG. 24. A black matrix or black stripes known in the field of CRT may be arranged to fill the blank areas of the transparent electrode that are not occupied by the fluorescent matrix or stripes. Similarly, a metal back layer of any known type may be arranged on the fluorescent members. The transparent electrode is electrically connected to the outside of the vacuum container by way of a terminal EV so that a voltage may be applied thereto in order to accelerate electron beams.

In FIG. 24, S denotes the substrate of the electron source rigidly fitted to the bottom of the vacuum container VC, on which a number of surface conduction electron-emitting devices are arranged as described above by referring to FIG. 22. More specifically, a total of 200 device columns, each having 200 devices, are arranged on the substrate. Each device column is provided with a pair of wiring electrodes and the wiring electrodes of the apparatus are connected to the electrodes terminals Dp1 through Dp200 and Dm1 through Dm200 arranged on the respective opposite sides of the panel in an alternate manner so that electric drive signals may be applied to the devices from outside of the vacuum container.

Stripe-shaped grid electrodes GR are arranged between the substrate S and the face plate. There are provided a total of 200 grid electrodes GR arranged in a direction perpendicular to that of the device columns (or along the Y-direction) and each grid electrode has a given number of openings Gh for allowing electron beams to pass therethrough. More specifically, while a circular opening Gh is typically provided for each surface conduction electron-emitting device, the openings may alternatively be realized in the form of a mesh. The grid electrodes are electrically connected to the outside of the vacuum container via respective electric terminals G1 through G200. Note that the grid electrodes may be differently arranged in terms of shape and location from those of FIG. 24 so long as they can successfully modulate electron beams emitted from the surface conduction electron-emitting devices. For instance, they may be arranged around or in the vicinity of the surface conduction electron-emitting devices.

The above described display panel comprises surface conduction electron-emitting devices arranged in 200 device columns and 200 grid electrodes to form an X-Y matrix of 200×200. With such an arrangement, an image can be displayed on the screen on a line by line basis by applying a modulation signal to the grid electrodes for a single line of an image in synchronism with the operation of driving (scanning) the surface conduction electron-emitting devices on a column by column basis to control the irradiation of electron beams onto the fluorescent film.

Figure 25:
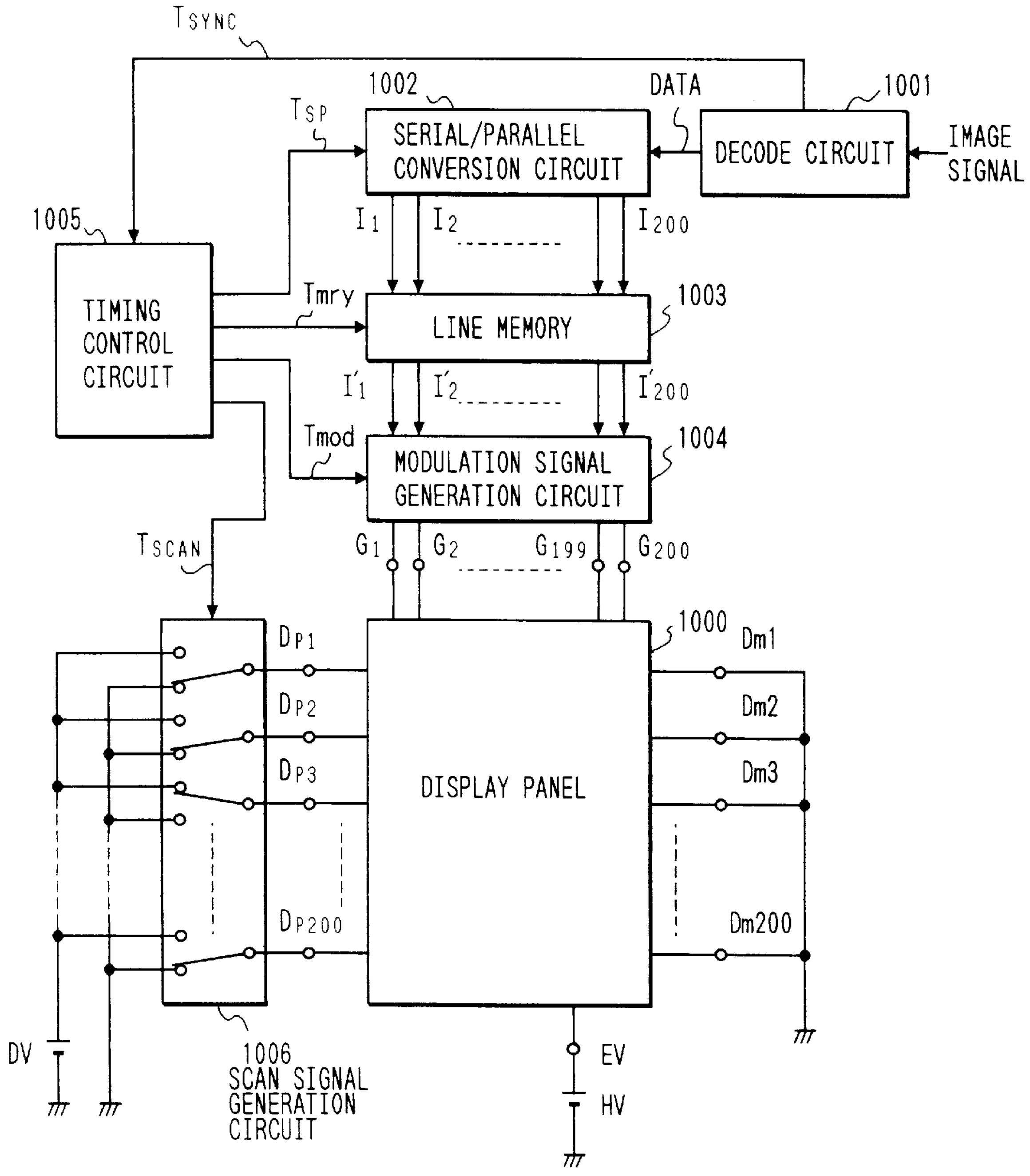
FIG. 25 is a block diagram of an electric circuit for driving an image-forming apparatus manufactured by a method according to the invention in Example 11.

FIG. 25 is a block diagram of an electric circuit to be used for driving the display panel of FIG. 24. In FIG. 25, the circuit comprises the display panel 1000 of FIG. 24, a decode circuit 1001 for decoding composite image signals transmitted from outside, a serial/parallel conversion circuit 1002, a line memory 1003, a modulation signal generation circuit 1004, a timing control circuit 1005 and a scan signal generating circuit 1006. The electric terminals of the display panel 1000 are connected to the related circuits. Specifically, the terminal EV is connected to a voltage source HV for generating an acceleration voltage of 10[kV] and the terminals G1 through G200 are connected to the modulation signal generation circuit 1004 while the terminals Dp1 through Dp200 are connected to the scan signal generation circuit 1006 and the terminals Dm1 through Dm200 are grounded.

Now, how each component of the circuit operates will be described. The decode circuit 1001 is a circuit for decoding incoming composite image signals such as NTSC television signals and separating brightness signals and synchronizing signals from the received composite signals. The former are sent to the serial/parallel conversion circuit 1002 as data signals and the latter are forwarded to the timing control circuit 1005 as Tsync signals. In other words, the decode circuit 1001 rearranges the values of brightness of the primary colors of RGB corresponding to the arrangement of color pixels of the display panel 1000 and serially transmits them to the serial/parallel conversion circuit 1002. It also extracts vertical and horizontal synchronizing signals and transmits them to the timing control circuits 1005. The timing control circuit 1005 generates various timing control signals in order to coordinate the operational timings of different components by referring to said synchronizing signal Tsync. More specifically, it transmits Tsp signals to the serial/parallel conversion circuit 1002, Tmry signals to the line memory 1003, Tmod signals to the modulation signal generation circuit 1004 and Tscan signals to the scan signal generation circuit 1005.

The serial/parallel conversion circuit 1002 samples brightness signals Data it receives from the decode circuit 1001 on the basis of timing signals Tsp and transmits them as 200 parallel signals I1 through I200 to the line memory 1003. When the serial/parallel conversion circuit 1002 completes an operation of serial/parallel conversion on a set of data for a single line of an image, the timing control circuit 1005 a write timing control signal Tmry to the line memory 1003. Upon receiving the signal Tmry, it stores the contents of the signals I1 through I200 and transmits them to the modulation signal generation circuit 1004 as signals I'1 through I'200 and holds them until it receives the next timing control signal Tmry.

The modulation signal generation circuit 1004 generates modulation signals to be applied to the grid electrodes of the display panel 1000 on the basis of the data on the brightness of a single line of an image it receives from the line memory 1003. The generated modulation signals are simultaneously applied to the modulation signal terminals G1 through G200 in correspondence to a timing control signal Tmod generated by the timing control circuit 1005. While modulation signals typically operate in a voltage modulation mode where the voltage to be applied to a device is modulated according to the data on the brightness of an image, they may alternatively operate in a pulse width modulation mode where the length of the pulse voltage to be applied to a device is modulated according to the data on the brightness of an image.

The scan signal generation circuit 1006 generates voltage pulses for driving the device columns of the surface conduction electron-emitting devices of the display panel 1000. It operates to turn on and off the switching circuits it comprises according to timing control signals Tscan generated by the timing control circuit 1005 to apply either a drive voltage VE[V] generated by a constant voltage source DV and exceeding the threshold level for the surface conduction electron-emitting devices or the ground potential level (or 0[V]) to each of the terminals Dp1 through Dp200.

Figures 26A, 26B, 26C, 26D, 26E, 26F:
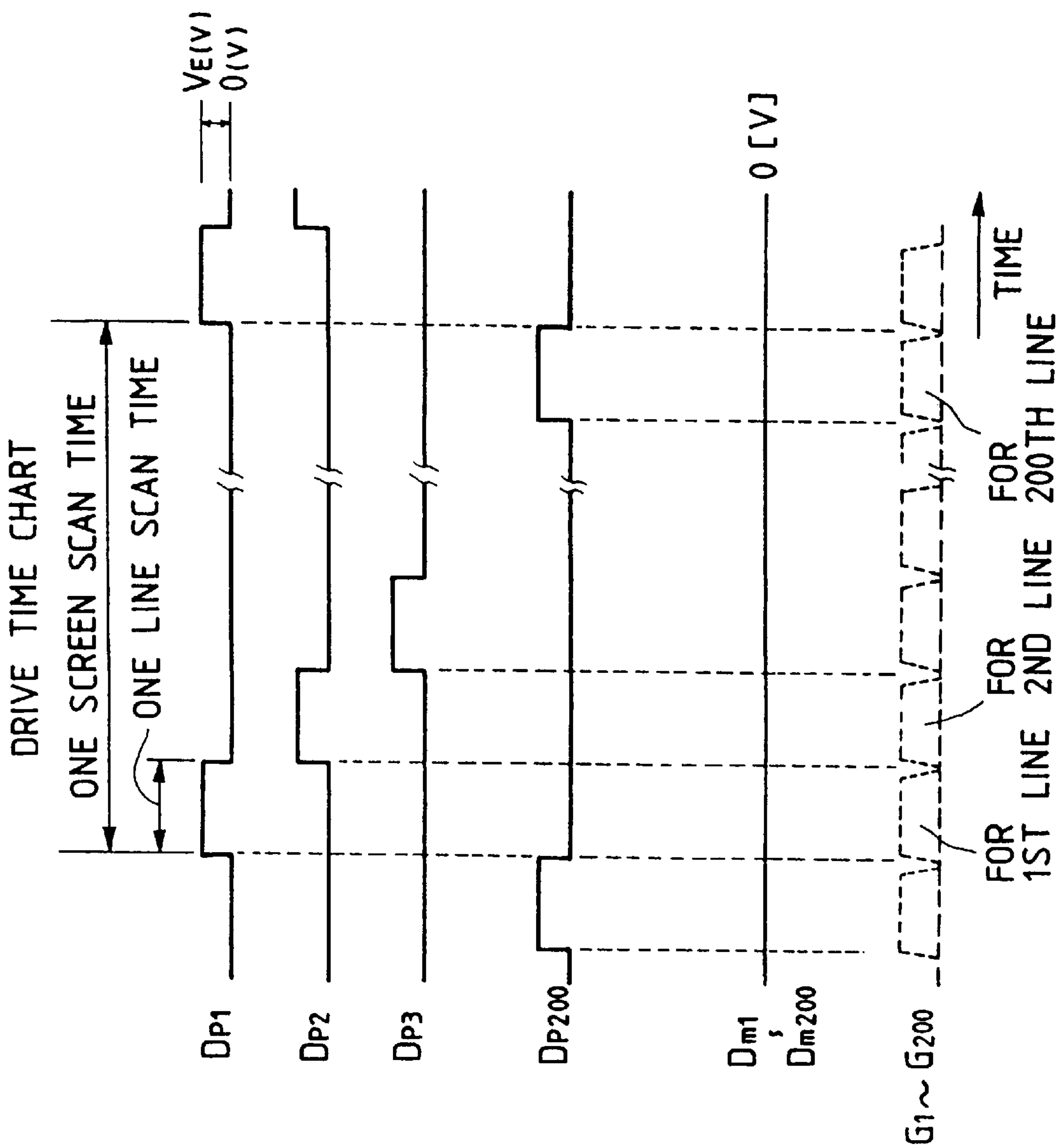
FIG. 26 is a timing chart for driving an image-forming apparatus manufactured by a method according to the invention in Example 11.

As a result of coordinated operations of the above described circuits, drive signals are applied to the display panel 1000 with the timings as illustrated in the graphs of FIG. 26. In FIG. 26, graphs (a) through (d) show part of signals to be applied to the terminals Dp1 through Dp200 of the display panel from the scan signal generation circuit 1006. It is seen that a voltage pulse having an amplitude of VE[V] is applied sequentially to Dp1, Dp2, Dp3, . . . within a period of time for display a single line of an image. On the other hand, since the terminals Dm1 through Dm200 are constantly grounded and held to 0[V], the device columns are sequentially driven by the voltage pulse to emit electron beams from the first column.

In synchronism of this operation, the modulation signal generation circuit 1004 applies modulation signals to the terminals G1 through G200 for each line of an image with the timing as shown by the dotted line in graph (f) of FIG. 26. Modulation signals are sequentially selected in synchronism with the selection of scan signals until an entire image is displayed. By continuously repeating the above operation, moving images are displayed on the display screen for television.

A flat panel type CRT comprising an electron source of FIG. 22 has been described above. Now, a panel type CRT comprising an electron source of FIG. 23 will be described below by referring to FIG. 27.

Figure 27:
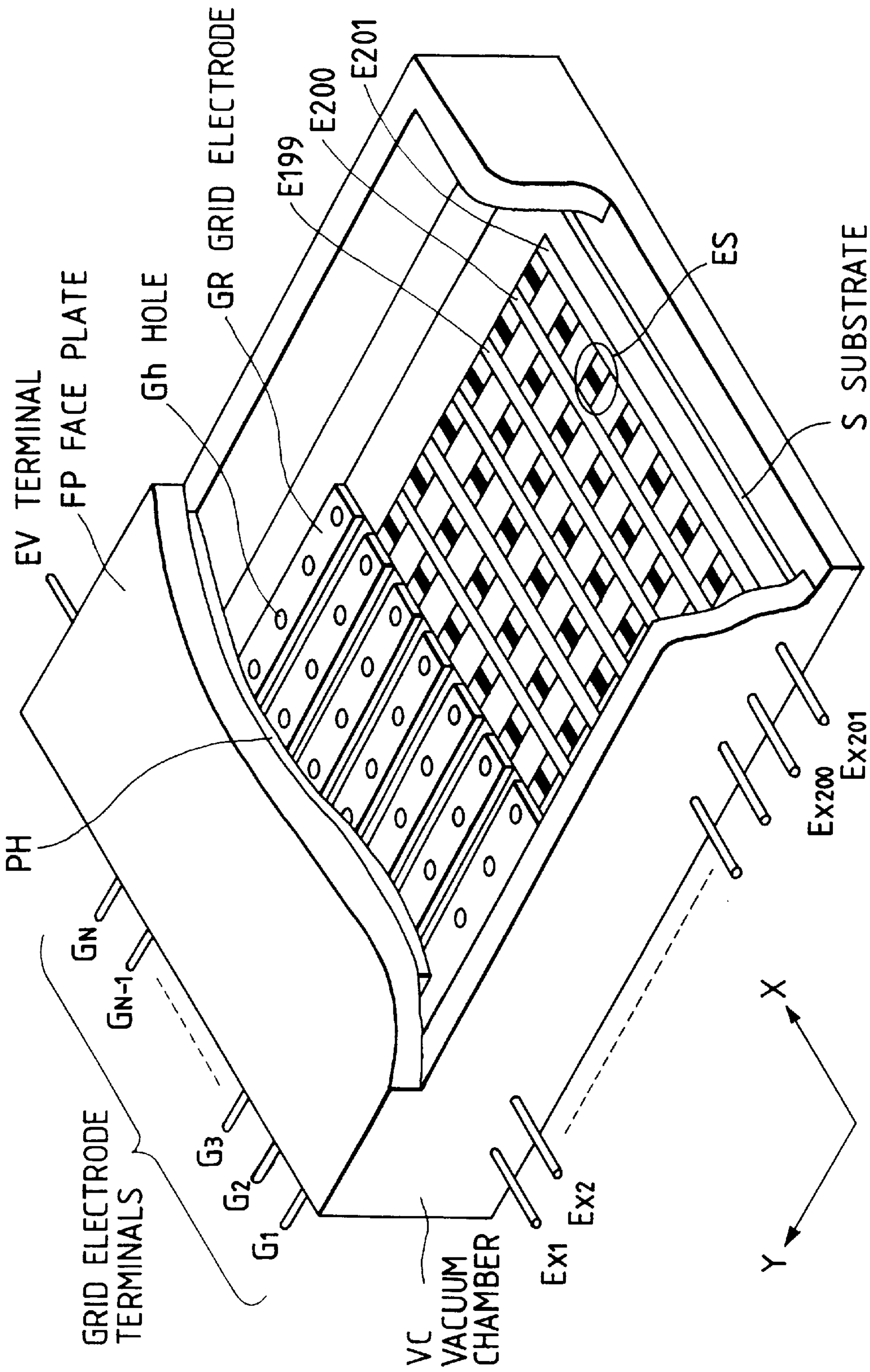
FIG. 27 is a partially cutaway schematic perspective view of an image-forming apparatus manufactured by a method according to the invention in Example 11, showing the configuration of its display panel.

The panel type CRT of FIG. 27 is realized by replacing the electron source of the CRT of FIG. 24 with the one illustrated in FIG. 23, which comprises an X-Y matrix of 200 columns of electron-emitting devices and 200 grid electrodes. Note that the 200 columns of surface conduction electron-emitting devices are respectively connected to 201 wiring electrodes E1 through E201 and, therefore, the vacuum container is provided with a total of 201 electrode terminals Ex1 through Ex201.

Figure 28:
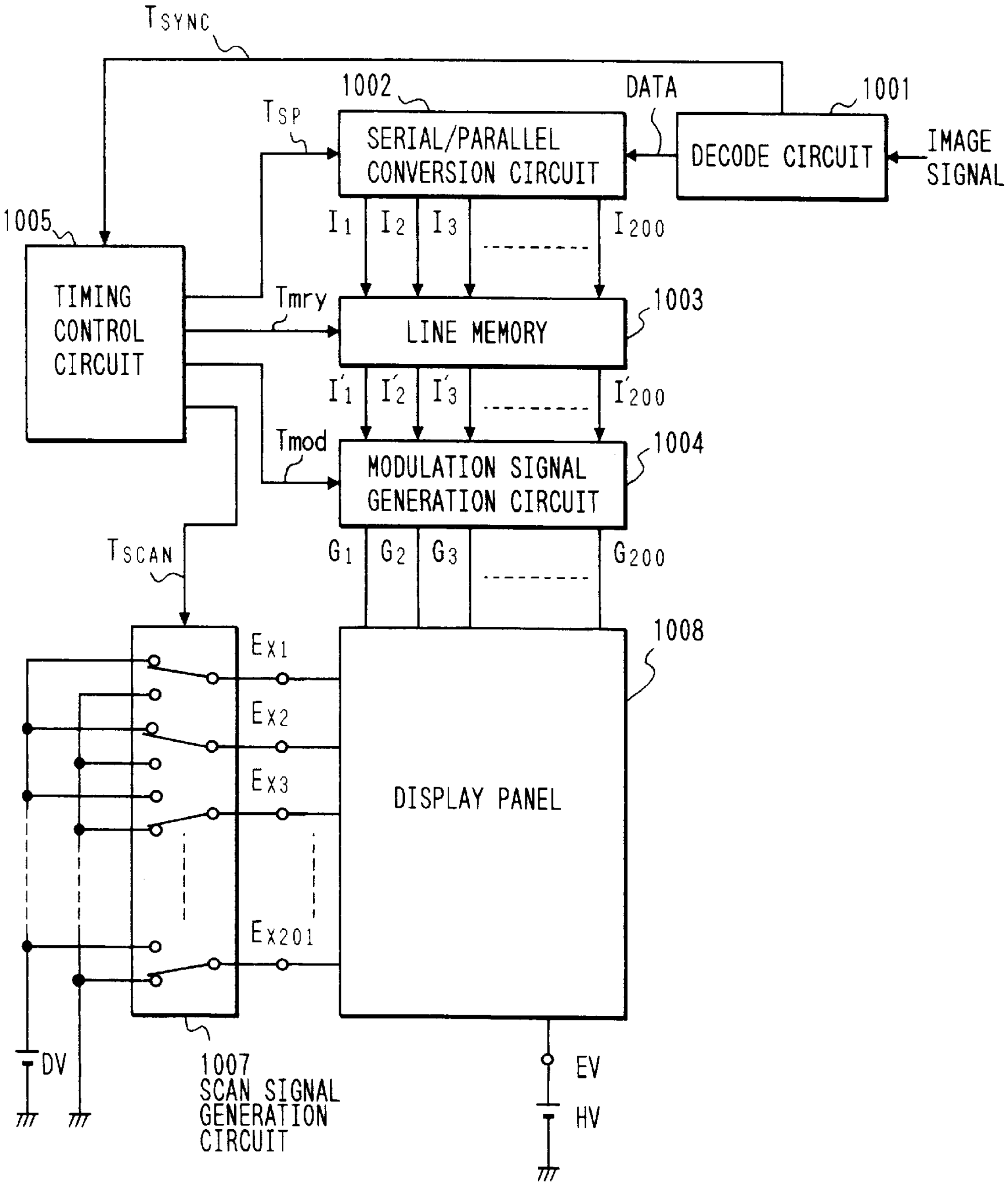
FIG. 28 is a block diagram of an electric circuit for driving an image-forming apparatus manufactured by a method according to the invention in Example 11.
Figures 29A, 29B, 29C, 29D, 29E, 29F, 29G, 29H, 29I:
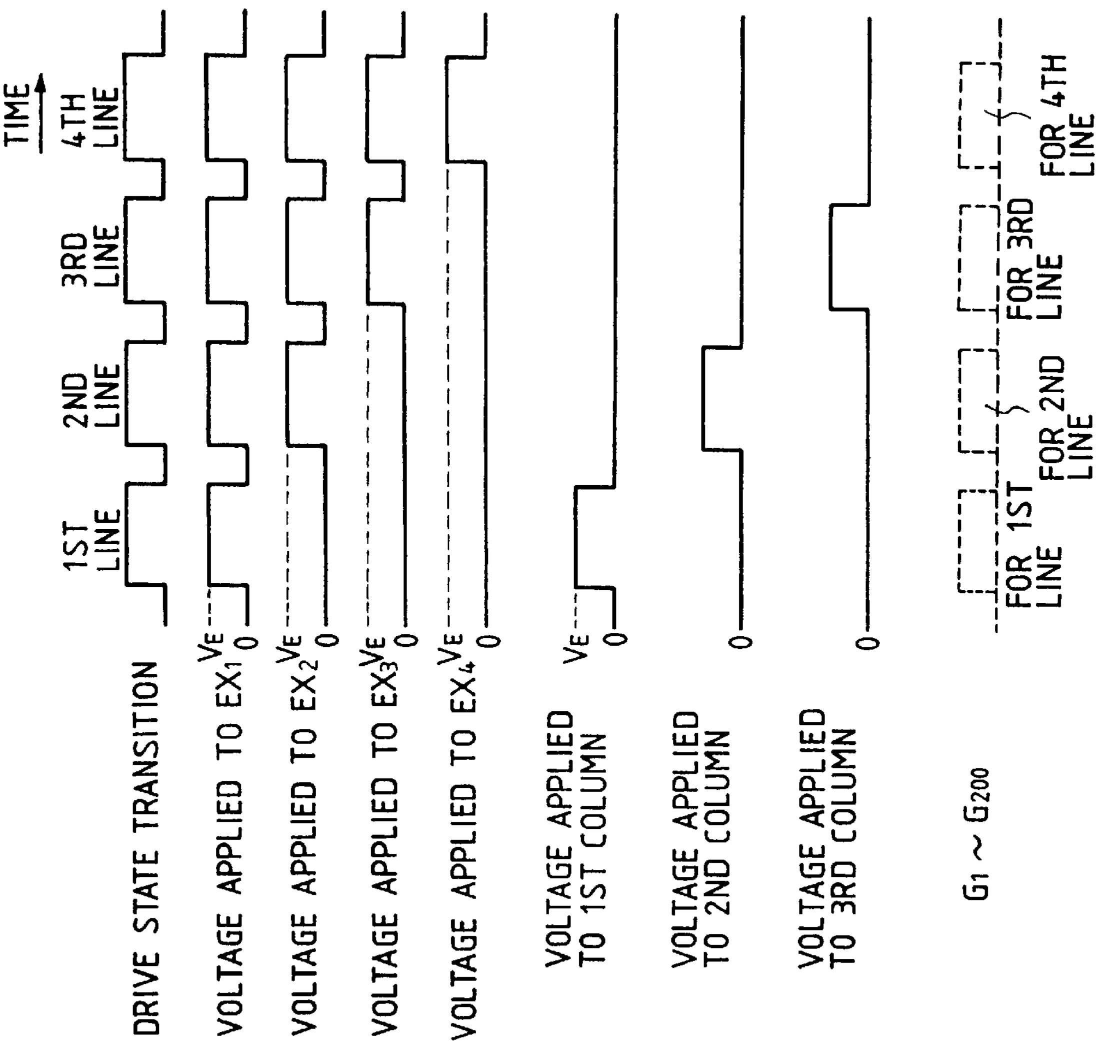
FIG. 29 is a timing chart for driving an image-forming apparatus manufactured by a method according to the invention in Example 11.

FIG. 28 shows a block diagram of a drive circuit for driving the display panel 1008. This circuit has a configuration basically same as that of FIG. 25 except the scan signal generation circuit 1007. The scan signal generation circuit 1007 applies either a drive voltage VE[V] generated by a constant voltage source DV and exceeding the threshold level for the surface conduction electron-emitting devices or the ground potential level (0[V]) to each of the terminals of the display panel. FIG. 29, shows chart of the timings with which certain signals are applied to the display panel. The display panel operates to display an image with the timing as illustrated in graph (a) of FIG. 29 as drive signals shown in graphs (b) through (e) of FIG. 29 are applied to the electrode terminals Ex1 through Ex4 from the scan signal generation circuit 1007 and, consequently, voltages as shown in graphs (f) through (h) of FIG. 29 are sequentially applied to the corresponding columns of surface conduction electron-emitting devices to drive the latter. In synchronism with this operation, modulation signals are generated by the modulation signal generation circuit 1004 with the timing as shown in graph (i) of FIG. 29 to display images on the display screen.

An image-forming apparatus of the type realized in this example operates very stably, showing full color images with excellent gradation and contrast.

Example 12

In this example, there was prepared an image-forming apparatus designed to display on the display panel of Example 10 images and data supplied from different sources including television broadcasting systems as illustrated in FIG. 10 and described in Example 6 above.

Since the display panel of the apparatus comprises an electron source realized by arranged electron-emitting devices according to the invention and hence can be made very thin, such an apparatus can be remarkably down-sized in terms of depth. Additionally, such an apparatus can be made to have a large and bright display screen that offers clear and impressive pictures with a particularly wide viewing angle.

[Advantages of the Invention]

The present invention provides the following advantages.

1) Thin films for forming an electron-emitting region can be produced in a rigorously controlled manner in terms of the film thickness and the electric resistance per unit area. Therefore, electron-emitting devices can be manufactured with minimum variances in the electron-emitting performance.

2) The present invention offers an effective method of manufacturing an image-forming apparatus having a large display screen realized by arranging a large number of electron-emitting devices. Such an apparatus can provides high quality images because the variances in the brightness of the electron-emitting devices can be minimized.

3) The present invention provides an electron-emitting device and an image-forming apparatus that can be manufactured with a minimum number of manufacturing steps.

4) Since a method of manufacturing an electron-emitting device according to the invention does not involve conventional techniques including photolithography and dry-etching, the device can be manufactured at reduced cost. It is friendly to the environment because it uses a minimum amount of solvent.

5) The present invention offers an effective method of manufacturing an image-forming apparatus having a large display screen realized by arranging a large number of electron-emitting devices. The rate of manufacturing defective apparatuses can be minimized and the yield of manufacturing image-forming apparatuses can be improved.

What is claimed is:

1. A method of manufacturing an electron-emitting device, said method comprising:

a step of forming an electroconductive film between a pair of electrodes on a substrate and a subsequent step of producing an electron-emitting region in said electroconductive film, wherein said step of forming said electroconductive film on said substrate comprises a step of heating said substrate in an atmosphere containing oxygen and a gasified organic metal compound to a temperature higher than the decomposition temperature of said gasified organic metal compound, whereby molecules of said gasified organic metal compound contact said heated substrate and, upon said contact, decompose, leaving on said substrate a film of an oxide of said metal.

2. A method of manufacturing an electron-emitting device according to claim 1, wherein said electron-emitting region in the electroconductive film is formed bv applying electrical energy to said electroconductive film.

3. A method of manufacturing an electron-emitting device according to claim 1, wherein said organic metal compound is a complex of a metal carboxylate and an amine.

4. A method of manufacturing an electron-emitting device according to claim 3, wherein said metal carboxylate contains palladium.

5. A method of manufacturing an electron-emitting device according to claim 3, wherein said amine is di-n-propyl amine.

6. A method of manufacturing an electron-emitting device according to claim 3, wherein said amine is triethylamine.

7. A method of manufacturing an image-forming apparatus comprising a plurality of electron-emitting devices and an image-forming member for producing images when irradiated with electron beams, wherein said electron-emitting devices are manufactured by a method comprising a step of forming an electroconductive film between a pair of electrodes on a substrate and a subsequent step of producing an electron-emitting region in said electroconductive film, said step of forming said electroconductive film on said substrate comprising heating said substrate in an atmosphere containing oxygen and a gasified organic metal compound to a temperature higher than the decomposition temperature of said gasified organic metal compound, whereby molecules of said gasified organic metal compound contact said heated substrate and, upon said contact, decompose, leaving on said substrate a film of an oxide of said metal, and said step of producing said electron emitting region comprising applying electrical energy to said electroconductive film.

8. A method of manufacturing an image forming apparatus according to claim 7, wherein said organic metal compound is a complex of a metal carboxylate and an amine.

9. A method of manufacturing an image forming apparatus according to claim 8, wherein said metal carboxylate contains palladium.

10. A method of manufacturing an image forming apparatus according to claim 8, wherein said amine is di-n-propyl amine.

11. A method of manufacturing an image forming apparatus according to claim 8, wherein said amine is triethylamine.

* * * * *

UNITED STATES PATENT AND TRADEMARK OFFICE

CERTIFICATE OF CORRECTION

PATENT NO. : 6,063,453

DATED : May 16, 2000

INVENTOR(S) : YOSHINORI TOMIDA, ET AL.

It is certified that error appears in the above-identified patent and that said Letters Patent is hereby corrected as shown below:

COLUMN 1

Line 19, "device;" should read --devices;--;
Line 20, "include" should read --includes--;
Line 34, "forning" should read --forming--;
Line 34, "this" should be deleted.

COLUMN 2

Line 43, "makes" should read --make--;
Line 55, "operates" should read --operate--.

COLUMN 3

Line 32, "electrode," should read --electrodes,--;

COLUMN 5

Line 27, "sputtering," should read --sputtering, and--;
Line 38, "chemical vapor deposition" should read --Chemical Vapor Deposition--;
Line 67, "M/n," should read --Mn,--.

COLUMN 6

Line 9, "$PO_3^-$," should read --$PO_4^{3-}$,--.

COLUMN 8

Line 15, "components" should read --component--.

COLUMN 11

Line 29, "electron emitting" should read --electron-emitting--.

COLUMN 16

Line 35, "w.ere" should read --were--;
Line 64, "was" should read --were--.

UNITED STATES PATENT AND TRADEMARK OFFICE

CERTIFICATE OF CORRECTION

PATENT NO. : 6,063,453

DATED : May 16, 2000

INVENTOR(S) : YOSHINORI TOMIDA, ET AL.

It is certified that error appears in the above-identified patent and that said Letters Patent is hereby corrected as shown below:

COLUMN 21

Line 1, "collides" should read --collided--;
Line 22, "6%." should read --8%.--.

COLUMN 22

Line 53, "may" should read --(SECAM) may--.

COLUMN 23

Line 32, "given" should read --to given--.

COLUMN 24

Line 66, "carry" should read --carries--.

COLUMN 25

Line 6, "such" should read --in such--.

COLUMN 26

Line 34, "closely" should read --close--.

COLUMN 27

Line 62, "closely" should read --close--.

COLUMN 29

Line 18, close up right margin;
Line 19, close up left margin;
Line 49, "profile" should read --profile.--

COLUMN 31

Line 3, "collides" should read --collided--.

UNITED STATES PATENT AND TRADEMARK OFFICE
CERTIFICATE OF CORRECTION

PATENT NO. : 6,063,453

DATED : May 16, 2000

INVENTOR(S) : YOSHINORI TOMIDA, ET AL.

It is certified that error appears in the above-identified patent and that said Letters Patent is hereby corrected as shown below:

COLUMN 32

Line 29, "denote" should read --denotes--.

COLUMN 33

Line 60, "Data" should read --data--.

COLUMN 34

Line 38, "for" should read --to--.

COLUMN 35

Line 7, ", shows" should read --shows a--;
Line 50, "provides" should read --provide--.

Signed and Sealed this

Twenty-fourth Day of April, 2001

Attest:

NICHOLAS P. GODICI

*Attesting Officer*

*Acting Director of the United States Patent and Trademark Office*